US006978525B2

(12) United States Patent
Iwase et al.

(10) Patent No.: US 6,978,525 B2
(45) Date of Patent: Dec. 27, 2005

(54) METHOD OF MANUFACTURING A LAMINATION-TYPE PIEZOELECTRIC ELEMENT

(75) Inventors: Akio Iwase, Nishio (JP); Tetuji Itou, Kariya (JP); Toshio Ooshima, Oobu (JP); Shige Kadotani, Chita-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/770,405

(22) Filed: Feb. 4, 2004

(65) Prior Publication Data

US 2004/0183396 A1  Sep. 23, 2004

(30) Foreign Application Priority Data

Feb. 5, 2003 (JP) .............................. 2003-028844
Dec. 1, 2003 (JP) .............................. 2003-401715

(51) Int. Cl.[7] ........................ H04R 17/00; H01L 41/04; H01L 41/08; H01L 41/18; H02N 2/00
(52) U.S. Cl. .................... 29/25.35; 29/25.41; 29/25.42; 29/594; 29/830; 29/831; 29/846; 310/328; 310/311
(58) Field of Search .......................... 29/25.35, 25.41, 29/25.42, 594, 830, 831, 846; 310/328, 363, 310/369, 311; 219/600

(56) References Cited

U.S. PATENT DOCUMENTS 4,978,881 A * 12/1990 Wakita et al. ............... 310/328
5,237,239 A * 8/1993 Inoue et al. ................. 310/328
5,438,232 A * 8/1995 Inoue et al. ................. 310/328

FOREIGN PATENT DOCUMENTS

| JP | 62-239588 | | 10/1987 | |
| JP | 07-045469 | * | 2/1995 | ............ H01G 4/12 |
| JP | 2000-77733 | | 3/2000 | |
| JP | 2001-210886 | | 8/2001 | |
| JP | 2001-244514 | * | 9/2001 | ......... H01L 41/083 |

* cited by examiner

Primary Examiner—A. Dexter Tugbang
Assistant Examiner—Tai Nguyen
(74) Attorney, Agent, or Firm—Nixon & Vanderhye P.C.

(57) ABSTRACT

A method of manufacturing a lamination-type piezoelectric element includes forming a ceramic laminated body in which ceramic layers and inner electrode layers are alternately laminated on each other. A pair of outer electrodes are respectively joined to a pair of joining faces formed on an outer circumferential face of the ceramic laminated body. A belt-shaped outer circumferential groove portion coming into contact with an outer circumferential end portion of at least some part of the inner electrode layers is formed on the outer circumferential face of the ceramic laminated body. This outer circumferential groove portion has at least one dent portion protruding from the adjoining portion. The outer circumferential groove portion has at least one of an insulating portion made of insulating material and a conductive portion made of conductive material.

9 Claims, 26 Drawing Sheets

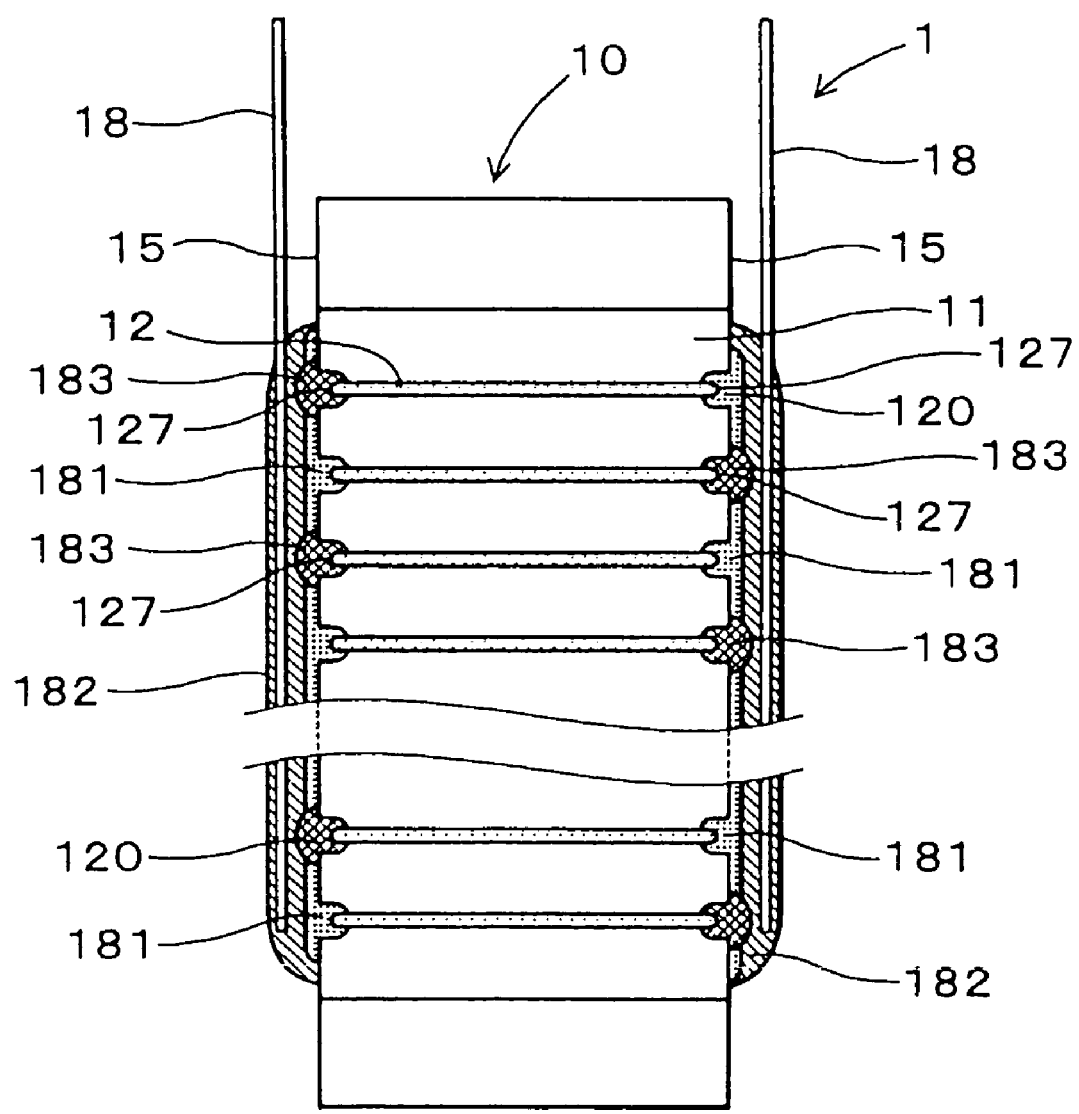

METHOD OF MANUFACTURING A LAMINATION-TYPE PIEZOELECTRIC ELEMENT

FIELD OF THE INVENTION

The present invention relates to a lamination-type piezoelectric element including: a ceramic laminated body in which ceramic layers and inner electrode layers are alternately laminated on each other; and an outer electrode formed on the ceramic laminated body. The present invention also relates to a method of manufacturing the lamination-type piezoelectric element.

DESCRIPTION OF THE RELATED ART

There is provided a lamination-type piezoelectric element composed in such a manner that a pair of outer electrodes are joined to a ceramic laminated body, in which a large number of inner electrode layers and ceramic layers are alternately laminated on each other, via a conductive portion such as a layer of conductive additive or a baking electrode.

For example, a ceramic laminated body of the overall face electrode structure is a laminated body in which green sheet pieces, on the overall lamination faces of which conductive paste is printed, are put on each other. In this ceramic laminated body of the overall face electrode structure, the inner electrode layer is exposed outside from the entire outer circumference.

In the ceramic laminated body of the overall face electrode structure, on two outer circumferential sides in the circumferential direction, an insulating portion for covering the inner electrode layer is arranged on every other layer in some cases. A joining face, to which the outer electrode electrically connected with the inner electrode layer on every other layer can be easily joined, is formed.

The inner electrode layer, which forms no insulating portion on the joining face, is joined to the outer electrode via a conductive portion made of conductive resin.

However, the following problems may be encountered in the above ceramic laminated body. Durability of the insulating portion for covering every other inner electrode layer on the joining face is not sufficiently high. Further, durability of the conductive portion for connecting the outer electrode is not sufficient.

When the above lamination-type piezoelectric element is operated and repeatedly expanded and contracted, repeated stress is generated in the insulating portion and the conductive portion. Therefore, when the piezoelectric element is used over a long period of time, the insulating portion and the conductive portion, which are joined to the joining face, may be peeled off.

When the insulating portion is peeled off, insulation in the lamination-type piezoelectric element becomes insufficient, which may cause an electrical leakage. When the conductive portion is peeled off, electric power supply to some part of the inner electrode layers is shut off, and normal operation of the lamination-type piezoelectric element is obstructed.

Especially, in the case of a lamination-type piezoelectric element applied to a fuel injector of an automobile engine used in a severe environment of high temperature and intense vibration, there is high possibility of the occurrence of a problem such as insulation deterioration. That is, when expansion and contraction are repeated under the condition of high temperature of 150° C. to 200° C. and heavy load, insulating material made of epoxy or silicon resin is further deteriorated by high temperatures and fatigue, which may cause cracks and peeling of the insulating portion.

DISCLOSURE OF THE INVENTION

The present invention has been accomplished to solve the above problems of the prior art. It is an object of the present invention to provide a lamination-type piezoelectric element and a method of manufacturing the lamination-type piezoelectric element, the electrical reliability and durability of which are high.

According to the first embodiment, the present invention provides a lamination-type piezoelectric element comprising: a ceramic laminated body in which ceramic layers and inner electrode layers are alternately laminated on each other; and a pair of outer electrodes respectively joined to a pair of joining faces formed on an outer circumferential face of the ceramic laminated body, wherein an outer circumferential groove portion coming into contact with an outer circumferential end portion of at least some part of the inner electrode layers is formed at least on the joining faces on the outer circumferential faces of the ceramic laminated body, the outer circumferential groove portion has at least one dent portion which recesses inward from the outer circumferential faces of the ceramic laminated body, a shape of the dent portion itself or shapes of a plurality of dent portions connected to each other are formed into a belt-shape, the outer circumferential groove portion also has at least one or more protruding portions protruding from the periphery inside the dent portion or the outer circumferential groove portion also has a protruding portion protruding from the dent portion being arranged between the dent portions being adjacent to each other, and at least one of an insulating portion made of insulating material or a conductive portion made of conductive material is formed in the outer circumferential groove portion so that the dent portion can be embedded and the protruding portion can be covered.

In the lamination-type piezoelectric element according to the first embodiment of the invention, at least on the joining face, the outer circumferential groove portion is formed so that it can come into contact with the outer circumferential end portion on every other inner electrode layer. The insulating portion or the conductive portion is formed in this outer circumferential groove portion.

A portion formed in the dent portion in the insulating portion or the conductive portion (referred to as an insulating portion hereinafter) is formed in such a manner that the portion bites inward from the outer circumferential face of the ceramic laminated body like a wedge. Therefore, the insulating portion can be strongly fixed to the ceramic laminated body by the wedge effect (anchor effect).

This outer circumferential groove portion is provided with the protruding portion described above which is protruding from the periphery.

Therefore, this protruding portion bites into the insulating portion formed in the outer circumferential groove portion like a wedge. Due to the wedge effect (anchor effect) exhibited by the protruding portion, the insulating portion can be more strongly joined to the outer circumferential groove portion. Therefore, peeling is seldom caused.

Concerning the insulating portion having the protruding portion and formed in the outer circumferential groove portion, the surface of which is formed into a protruding and recess shape, a contact face of the insulating portion with the outer circumferential groove portion is bent like a protruding and recess shape. Therefore, stress generated in the insulating portion according to the motion of the lamination-type piezoelectric element is dispersed on the surface formed into a protruding and recess shape, and cracks are seldom caused in the insulating portion by stress concentration.

As described above, according to the outer circumferential groove portion of the ceramic laminated body in the first embodiment of the present invention, the insulating portion and the conductive portion are seldom peeled off even when they are used over a long period of time. Further, the electrical reliability and durability of this lamination-type piezoelectric element composed of this ceramic laminated body are high.

In this connection, resin, glass or ceramics can be used for the insulating material composing the insulating portion.

Pb, Ag—Pb or Cu can be used for the conductive material composing the conductive portion.

The second embodiment of the present invention provides a method of manufacturing a lamination-type piezoelectric element which includes a ceramic laminated body, in which ceramic layers and inner electrode layers are alternately laminated on each other, and also includes a pair of outer electrodes respectively joined to a pair of joining faces formed on an outer circumferential face of the ceramic laminated body, the method of manufacturing the lamination-type piezoelectric element comprising:

a laminated body forming step of forming the ceramic laminated body;

a groove forming step of forming a dent portion coming into contact with an outer circumferential end portion of at least some part of the inner electrode layers by irradiating a laser beam onto at least the joining faces on the outer circumferential face of the ceramic laminated body so as to form an outer circumferential groove portion, the shape of the recess portion of which is formed into a belt-shape, or the shapes of a plurality of recess portions connected with each other of which are formed into a belt-shape; and an embedding step of forming at least one of the insulating portion made of insulating material and a conductive portion made of conductive material in a outer circumferential groove portion.

According to the method of manufacturing a lamination-type piezoelectric element of the second embodiment of the present invention, in the groove forming step, the outer circumferential groove portion can be highly accurately formed on the outer circumferential face of the ceramic laminated body. When the aforementioned dent portion is formed by means of laser beam machining, the ceramic laminated body seldom experiences stress in the process of machining. Accordingly, there is a low possibility of cracks being caused.

According to the means of laser beam machining, the degree of freedom of machining is so high that the aforementioned dent portion of the outer circumferential groove portion can be easily machined.

The present invention will become more apparent from the following descriptions of embodiments with reference to the accompanying drawings.

BRIEF DESCRIPTION OF THE DRAWINGS

FIG. 24 is an enlarged view of portion A in FIG. 23.

FIG. 26 is a sectional view showing a sectional structure of the lamination-type piezoelectric element in Embodiment 4 of the present invention.

BEST MODE FOR CARRYING OUT THE INVENTION

Figure 1:
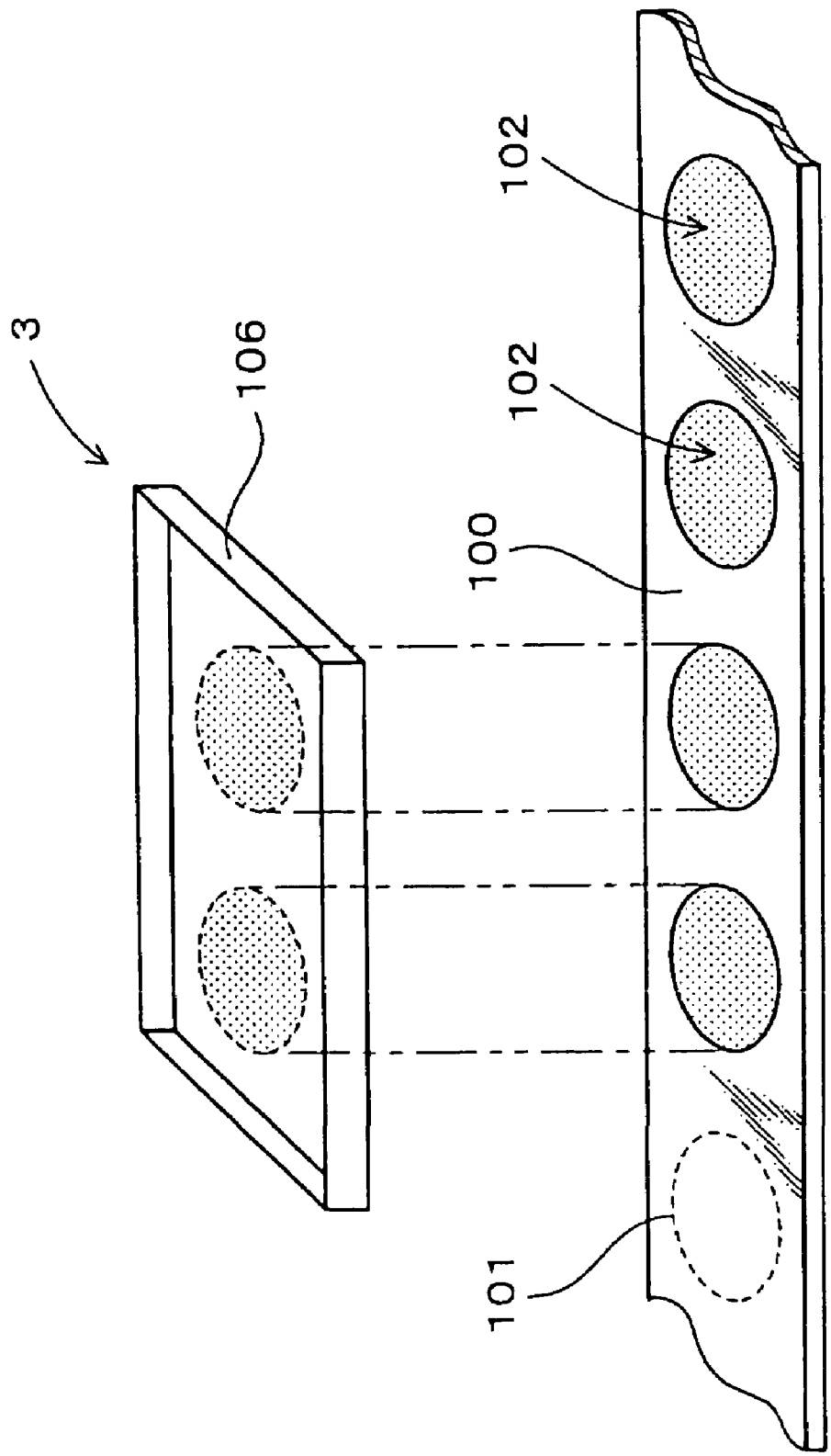
FIG. 1 is a schematic illustration showing a printing step in Embodiment 1 of the present invention.

In a lamination-type piezoelectric element according to the first embodiment of the present invention, the following are preferable. The outer circumferential groove portion is formed coming into contact with the outer circumferential end portion of every other inner electrode layer of the joining face, concerning the inner electrode layer, on one joining face of which the outer circumferential groove portion is formed, the outer circumferential groove portion is not formed on the other joining face, concerning the inner electrode layer, on one joining face of which the outer circumferential groove portion is not formed, the outer circumferential groove portion is formed on the other joining face, and an insulating portion is formed in the outer circumferential groove portion concerned.

In this case, the insulating portion can be strongly formed for the outer circumferential groove portion formed so that it can be contacted with the outer circumferential end portion of every other inner electrode layer on the joining layer.

The outer electrode can be easily joined to the joining face from which every other inner electrode layer is exposed, and an electrical leakage seldom occurs. Further, the insulating portion can exhibit an excellent insulating property even when it is used over a long period of time.

The following are preferable. The outer circumferential groove portion is formed coming into contact with the outer circumferential end portions of all inner electrode layers on the joining face, the insulating portion and the conductive portion are alternately formed on every other layer in the outer circumferential groove portion formed on the joining face, the inner electrode layer coming into contact with the insulating portion on one joining face comes into contact with the conductive portion on the other joining face, and the inner electrode layer coming into contact with the conductive portion on one joining face comes into contact with the insulating portion on the other joining face.

In this case, the conductive portion and the insulating portion can be strongly joined to the outer circumferential groove portion on the joining face. Therefore, this lamination-type piezoelectric element can stably impress voltage upon all ceramic layers, and an electrical leakage is seldom caused. Therefore, the electrical reliability of this lamination-type piezoelectric element is high.

The following are preferable. The outer circumferential groove portion coming into contact with the outer circumferential end portion of the inner electrode layer is formed on the entire outer circumferential face except the joining face of the ceramic laminated body, and the insulating portion is formed in the outer circumferential groove portion.

In this case, in addition to the operational effect of the outer circumferential groove portion formed coming into contact with the outer circumferential end portion of the inner electrode layer on the joining face, the insulating property on the outer circumferential face except the joining face in the ceramic laminated body can be enhanced. Therefore, in this laminated type piezoelectric element, the occurrence of an electrical leakage can be further suppressed all over the outer circumferential face of the ceramic laminated body.

The following are preferable. A plurality of bowl-shaped machined holes, the diameter of which is reduced as it goes deeper, are formed in the dent portion, peripheral edge portions of the holes, which are adjacent to each other, overlap with each other, and the protruding portion is formed between the holes, which are adjacent to each other, in such a manner that the protruding portion is protruding.

In this case, a plurality of holes machined along the inner electrode layer respectively form a single dent portion. In the outer circumferential groove portion composed of the dent portions, the protruding portion protruding from between the machined holes adjacent to each other can be easily formed.

The following are preferable. The shape of the dent portion is formed into a bowl-shape, the diameter of which is reduced as it goes deeper, a plurality of the dent portions are formed at discrete positions arranged in a belt-shape, and the protruding protrusion is formed between the dent portions which are independently arranged and adjacent to each other.

In this case, it is unnecessary to form the dent portions all over the outer circumferential groove portion. Therefore, the outer circumferential groove portion can be effectively formed while a quantity of laser beam machining is being reduced.

It is preferable that the outer circumferential end portion of the inner electrode layer is protruded outward on the bottom face of the dent portion.

In this case, the outer circumferential end portion of the inner electrode layer bites into the conductive portion embedding the dent portions or into the insulating portion like a wedge. Therefore, by the wedge effect (the anchor effect) provided by the outer circumferential end portion of the inner electrode layer, the conductive portion embedding the dent portions or the insulating portion can be strongly held.

It is preferable that a protruding distance of the outer circumferential end portion of the inner electrode layer is not less than the thickness of the inner electrode layer.

In this case, the wedge effect (the anchor effect) exhibited by the outer circumferential end portion of the inner electrode layer for the conductive portion embedding the dent portions or for the insulating portion can be enhanced. Therefore, the conductive portion or the insulating portion can be more strongly held.

In this connection, it is preferable that the upper limit of the protruding distance is set at the depth of the dent portion.

In this case, the ceramic layer and the inner electrode layer can be laminated on each other so that the end portion on the outer circumferential side of the ceramic layer and the outer circumferential end portion of the inner electrode layer can form a substantially uniform face. After that, when the dent portions are formed avoiding the outer circumferential end portion of the inner electrode layer, the upper limit of the protruding distance can be effectively provided.

In a method of manufacturing a lamination-type piezoelectric element according to the second embodiment of the present invention, the following are preferable. The outer circumferential groove portion having at least one protruding portion protruding from the periphery inside the dent portion or having at least one protruding portion protruding from the dent portion, arranged between the dent portions adjacent to each other is formed by adjusting an irradiating condition of the laser beam in the groove forming step, and the dent portion is embedded so as to cover the protruding portion by forming at least one of an insulating portion made of insulating material and a conductive portion made of conductive material into the outer circumferential groove portion in the embedding step.

In this case, the outer circumferential groove portion can be effectively formed by means of laser beam machining, the degree of machining of which is high. That is, when the means of laser beam machining is adopted, the outer circumferential groove including the protruding portion can be easily formed.

The following are preferable. A laser beam is irradiated so that an intensity of irradiating energy, which irradiates at a position where the protruding portion is to be formed, can be lower than an intensity of irradiating energy, which irradiates at a position adjacent to the position where the protruding portion, which protrudes in the direction of the normal line on the outer circumferential face of the ceramic laminated body, is to be formed, in the groove forming step.

In this case, the irradiating energy is defined as an integrated value (W·s) of the output (W) of a laser beam per unit time and the irradiating time (s).

According to the above method of irradiating a laser beam in which an intensity of irradiating energy of irradiating a laser beam to a position at which the protruding portion is to be formed is changed and also an intensity of irradiating energy of irradiating a laser beam to a position adjacent to the protruding portion is changed, the protruding portion protruding in the direction of the normal line on the outer circumferential face of the ceramic laminated body can be simply formed.

According to this method, an intensity of energy of irradiating a laser beam to a position at which the protruding portion is to be formed is made to be lower than an intensity of energy of irradiating a laser beam to a position adjacent to the position at which the protruding portion is to be formed. When the machined depth of the protruding portion from the outer circumferential face of the ceramic laminated body is made to be smaller than the machined depth of the adjacent portion in the periphery, the protruding portion can be protruded. In this connection, the intensity of energy of irradiating the protruding portion may be zero, and the machined depth of the protruding portion may be zero.

As a method of changing the aforementioned irradiating energy (W·s), for example, the method of changing an output (W) of the laser beam per unit time is used. Alternatively, the method of changing a period of time, in which the laser beam is irradiated, is used.

For example, the output (W) of the laser beam per unit time can be changed by changing the duty ratio, which is a ratio of the irradiating time of the laser beam duty-controlled to the time in which the laser beam is not irradiated. Alternatively, the output (W) of the laser beam per unit time can be changed by changing an intensity of the laser beam emitted from the laser beam generator.

The irradiating time (s) of the laser beam can be changed as follows. For example, while a position, at which the laser beam is to be irradiated in the ceramic laminated body, is being moved at a substantially constant speed, a pulse-like laser beam, which is subjected to ON-OFF control, is irradiated, so that a position, at which the laser beam irradiating time is zero, and a position, at which the laser beam irradiating time exceeds zero, can be distributed.

The irradiating time (s) of the laser beam can be also changed as follows. While the laser beam, the output of which is substantially constant, is being continuously irradiated, a moving speed of the laser beam irradiating position in the ceramic laminated body is increased or decreased so as to change the irradiating time. That is, when the moving speed is increased, the irradiating time can be reduced, and when the moving speed is decreased, the irradiating time can be extended.

Further, the laser beam may be irradiated at the discretely distributed positions when the irradiating position of the laser beam is moved step-wise. In this case, while the laser beam is being irradiated at the positions which are discretely distributed, the laser beam irradiating time, in which the laser beam is irradiated at the positions except the positions which are discretely distributed, can be made to be zero. Further, the laser beam irradiating time (s) can be changed at each laser beam irradiating position.

In this case, the output distribution in the laser beam spot is not completely uniform but the output distribution exhibits the normal distribution or the Gaussian distribution. Therefore, the cross-sectional shape of the machined hole, which is formed when the laser beam is irradiated at one position, is not a perfect rectangle. Therefore, the cross-sectional shape of the machined hole is composed of an inclined face, that is, the cross-sectional shape of the machined hole is formed into a bowl-shape expanding toward the opening side.

Accordingly, in the case where two positions, which are located close to each other, are respectively irradiated with the laser beam and the machined hole is formed at each position, the inclined faces of the machined holes, which are adjacent to each other, cross each other, and a single dent portion is formed. At this time, in the middle of the machined holes which are adjacent to each other, the protruding portion, the machined depth of which is small, is formed.

On the other hand, when the laser beam irradiating positions are somewhat separated from each other, each machined hole can be independently arranged. In this case, a portion, the machined depth of which is zero, can be formed between the machined holes which are adjacent to each other, that is, the aforementioned protruding portion composed of the outer circumferential face of the ceramic laminated body can be formed.

Further, it is preferable that two or more machined grooves, which extend coming into contact with the outer circumferential end portion of the inner electrode layer, are formed in parallel in the laminating direction of the ceramic laminated body. In this case, it is possible to form the aforementioned protruding portion extending between the grooves adjacent to each other.

The adjoining relation between the grooves is the same as the adjoining relation between the machined holes. The adjoining grooves may be overlapped. Alternatively, the adjoining grooves may be arranged in parallel.

In this connection, the aforementioned outer circumferential groove portion may be formed by combining the machined groove and the machine hole arranged in parallel in the laminating direction of the ceramic laminated body.

The following are preferable. The belt-shaped dent portion extending zigzag is formed when the laser beam irradiating position is moved zigzag along the outer circumferential end portion of the inner electrode layer in the groove forming step, and the laser beam is irradiated so that the protruding portion protruding in the laminating direction of the ceramic laminated body can be formed in a bent portion of the dent portion.

In this case, it is possible to form the belt-shaped outer circumferential groove portion extending in the circumferential direction being bent zigzag. In the bent portion of the dent portion formed zigzag, a protruding portion protruding in the laminating direction of the ceramic laminated body can be formed.

The following are preferable. A method of manufacturing a lamination-type piezoelectric element, in which a laser beam is irradiated so that an intensity of irradiating energy, which irradiates at a position where the protruding portion is to be formed, can be lower than an intensity of irradiating energy, which irradiates at a position adjacent to the position where the protruding portion, which protrudes in the direction of the normal line on the outer circumferential face of the ceramic laminated body, is to be formed, in the groove forming step, and a method of manufacturing a lamination-type piezoelectric element, in which the belt-shaped dent portion extending zigzag is formed when the laser beam irradiating position is moved zigzag along the outer circumferential end portion of the inner electrode layer in the groove forming step and the laser beam is irradiated so that the protruding portion protruding in the laminating direction of the ceramic laminated body can be formed in a bent portion of the dent portion, are combined with each other and the laser beam is irradiated so as to form the protruding portion.

In this case, shapes of the protruding portion of the outer circumferential groove portion and the dent portion can be made to be more complicated.

In the embedding step, the insulating portion or the conductive portion can be more strongly formed with respect to the outer circumferential groove portion.

The following are preferable. The laser beam is irradiated at discrete positions distributed along the inner electrode layer by ON-OFF control in which irradiation and non-irradiation of the laser beam are repeated while a position at which the laser beam is to be irradiated is being continuously moved along the inner electrode layer of the ceramic laminated body.

In this case, the protruding portion in the outer circumferential groove portion can be easily, effectively formed. That is, only when ON-OFF control of the laser beam is conducted while the position, at which the laser beam is to be irradiated, is being moved on the outer circumferential face of the ceramic laminated body, can a plurality of the machined holes be formed at discrete positions distributed in the moving direction.

In this connection, the laser beam can be continuously irradiated when the position, at which the laser beam is irradiated, is fixed each time with respect to the discrete positions distributed along the inner electrode layer.

In this case, the substantially same outer circumferential groove portion as that formed by the laser beam irradiation described before can be also formed.

It is preferable that the laser beam is a beam generated by a $CO_2$ laser.

In this case, the light condensing property can be enhanced by reducing the divergent angle of the laser beam. Therefore, laser beam machining can be effectively executed with high accuracy by the laser beam, the energy density of which is high.

Further, duty control and ON-OFF control can be executed with high accuracy by utilizing the characteristic that the exciting time to reach the state of a high output is very short.

It is preferable that the wave-length of the laser beam is not less than 157 nm and not more than 10600 nm.

A reflection factor of the laser beam in the above wave-length band with respect to a metal surface such as an inner electrode layer is high. Accordingly, in the case where the dent portion is machined by utilizing the above laser beam, the machined depth of the ceramic layer can be made larger than the machined depth of the inner electrode layer.

Therefore, when the above laser beam is utilized, the above dent portion can be formed so that the outer circumferential end portion of the inner electrode layer can be protruded from the bottom face.

Further, according to the laser beam in the above wave-length band, the laser beam diameter can be reduced. Therefore, minute grooves can be machined.

Therefore, for example, in the case where the thickness of the ceramic layer of the ceramic laminated body is not less than 40 $\mu$m and not more than 120 $\mu$m, the operational effect provided by using the laser beam in the above wave-length band is especially effective.

In this connection, examples of the laser beam in the above wave-length band are: a laser beam generated by a UV laser in which the wave-length of the near infrared laser beam emitted by a YAG laser beam generator is converted when the near infrared laser beam is transmitted in the non-linear optical crystals; and a laser beam generated by the excimer laser, which is a gas laser, in which the laser beam is generated by exciting rare gas or mixed gas of rare gas and halogen gas.

It is preferable that the diameter of an irradiation spot of the laser beam is not more than 120 $\mu$m.

In this case, it is possible to realize a laser beam, the energy density of which is high. Further, laser beam machining can be appropriately conducted on the outer circumferential face of the ceramic laminated body from which the thin layer-shaped inner electrode layer is exposed.

It is preferable that stabilization baking of the ceramic laminated body is executed after the laser beam is irradiated and the dent portion is formed.

In general, when the laser beam is irradiated to the above ceramic layer, heat is generated on the ceramic layer by the laser beam irradiation. Therefore, the ceramic layer may change in quality. For example, the component composing the ceramic layer is changed into a semiconductor, and the electrical resistance may be lowered. This change in quality tends to occur especially on the outer surface of the ceramic layer. For the above reasons, in the ceramic laminated body which has been subjected to laser beam machining, the electrical insulating property of the outer surface is lowered, and an electrical leakage may be caused.

Therefore, when the aforementioned stabilization baking is executed after the laser beam has been irradiated, the ceramic layer is oxidized and stabilized again and the electrical insulating property can be enhanced.

Therefore, in the lamination-type piezoelectric element, which is manufactured by conducting the stabilization baking after the laser beam has been irradiated, there is no possibility of an electrical leakage being caused along the outer surface of the ceramic laminated body, that is, the electrical reliability of the lamination-type piezoelectric element is high.

Embodiment 1

Referring to FIGS. 1 to 10, the method of manufacturing a lamination-type piezoelectric element 1 of this embodiment will be explained below.

Figure 9:
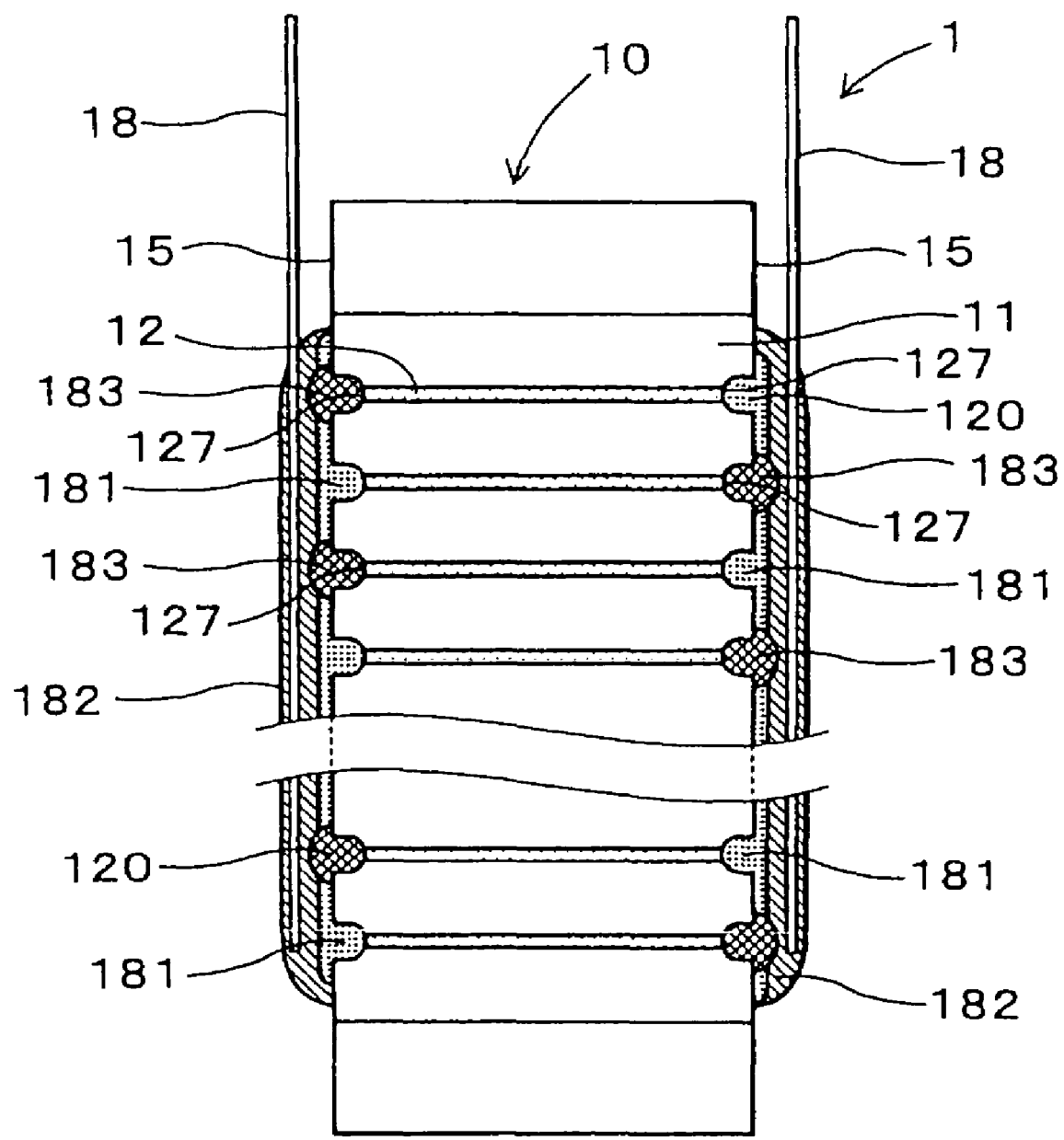
FIG. 9 is a sectional view showing a sectional structure of the lamination-type piezoelectric element in Embodiment 1 of the present invention.

As shown in FIG. 9, this embodiment is related to a lamination-type piezoelectric element 1 including: a ceramic laminated body 10 in which the ceramic layers 11 and the inner electrode layers 12 are alternately laminated on each other; and a pair of outer electrodes 18 respectively joined to a pair of joining faces 15 formed on the outer circumferential face of the ceramic laminated body 10.

Figure 10:
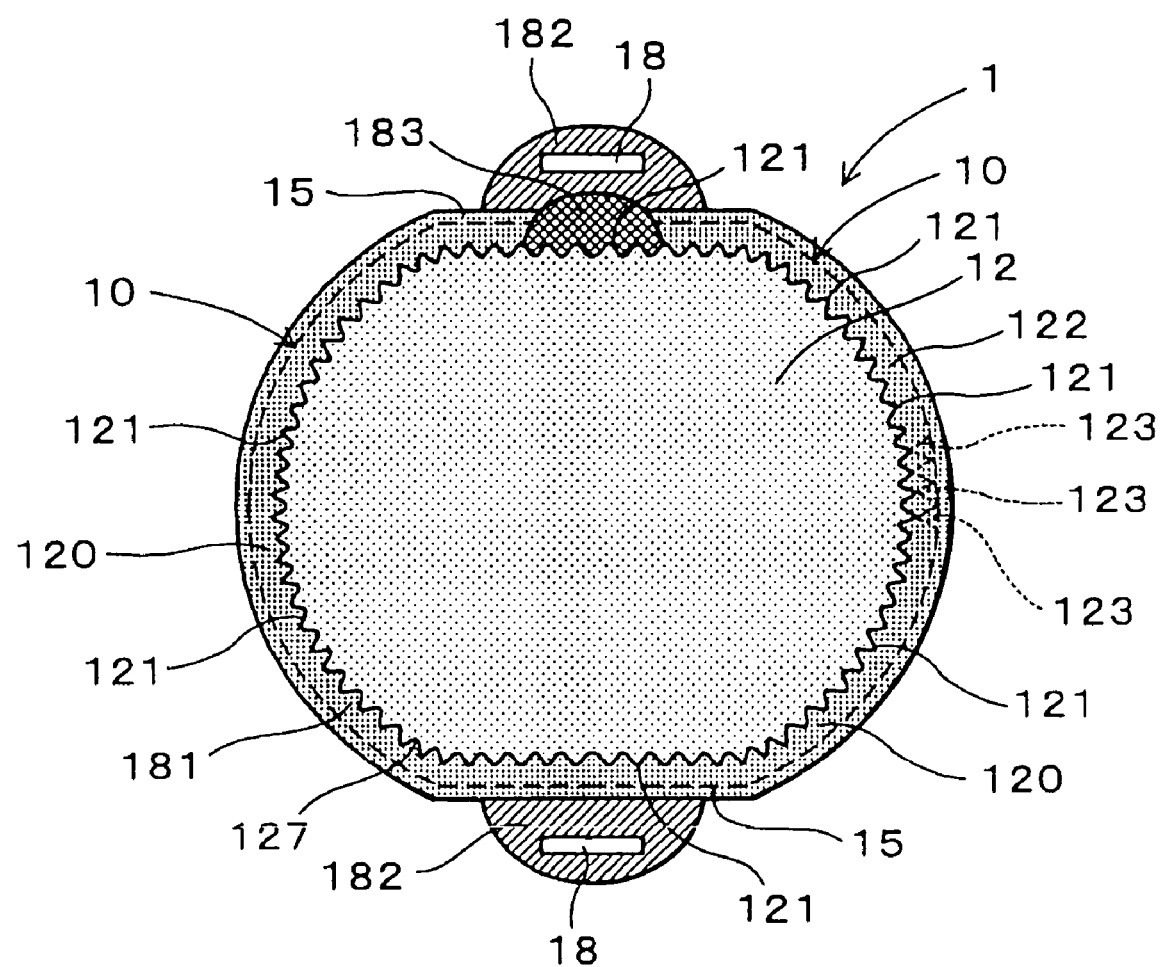
FIG. 10 is a sectional view showing a sectional structure of the lamination-type piezoelectric element along the inner electrode layer in Embodiment 1 of the present invention.

As shown in FIGS. 9 and 10, at least on the joining face 15 on the outer circumferential face of the ceramic laminated body 10, the outer circumferential groove portion 120 is formed which comes into contact with the outer circumferential end portion 127 of at least some part of the inner electrode layers 12.

This outer circumferential groove portion 120 includes at least one dent portion 122 which is dented inward from the outer circumferential face of the ceramic laminated body 10. The shape of the outer circumferential groove portion 120 is formed into a belt shape in which a plurality of dent portions 122 are put in a row. The outer circumferential groove portion 120 includes at least one protruding portion 121 protruding from the periphery inside the dent portion 122 or includes a protruding portion 121 protruding from the dent portion 122 arranged adjoining between the dent portions 122 adjacent to each other.

As shown in FIGS. 9 and 10, this outer circumferential groove portion 120 is formed in such a manner that the dent portion 122 is embedded in at least one of an insulating portion 181 made of insulating material and a conductive portion 183 made of conductive material and that the protruding portion 121 is covered.

The contents will be explained in detail as follows.

As shown in FIG. 9, the lamination-type piezoelectric element 1 manufactured in this embodiment is composed of the ceramic laminated body 10 in which the ceramic layers 11 of 80 $\mu$m thickness made of ceramics and the inner electrode layers 12 of 4 $\mu$m thickness formed on the entire laminated face are alternately laminated on each other to amount to 300 layers. A pair of outer electrodes 18 are joined to a pair of joining faces 15 on the outer circumferential face of the ceramic laminated body 10.

Figure 7:
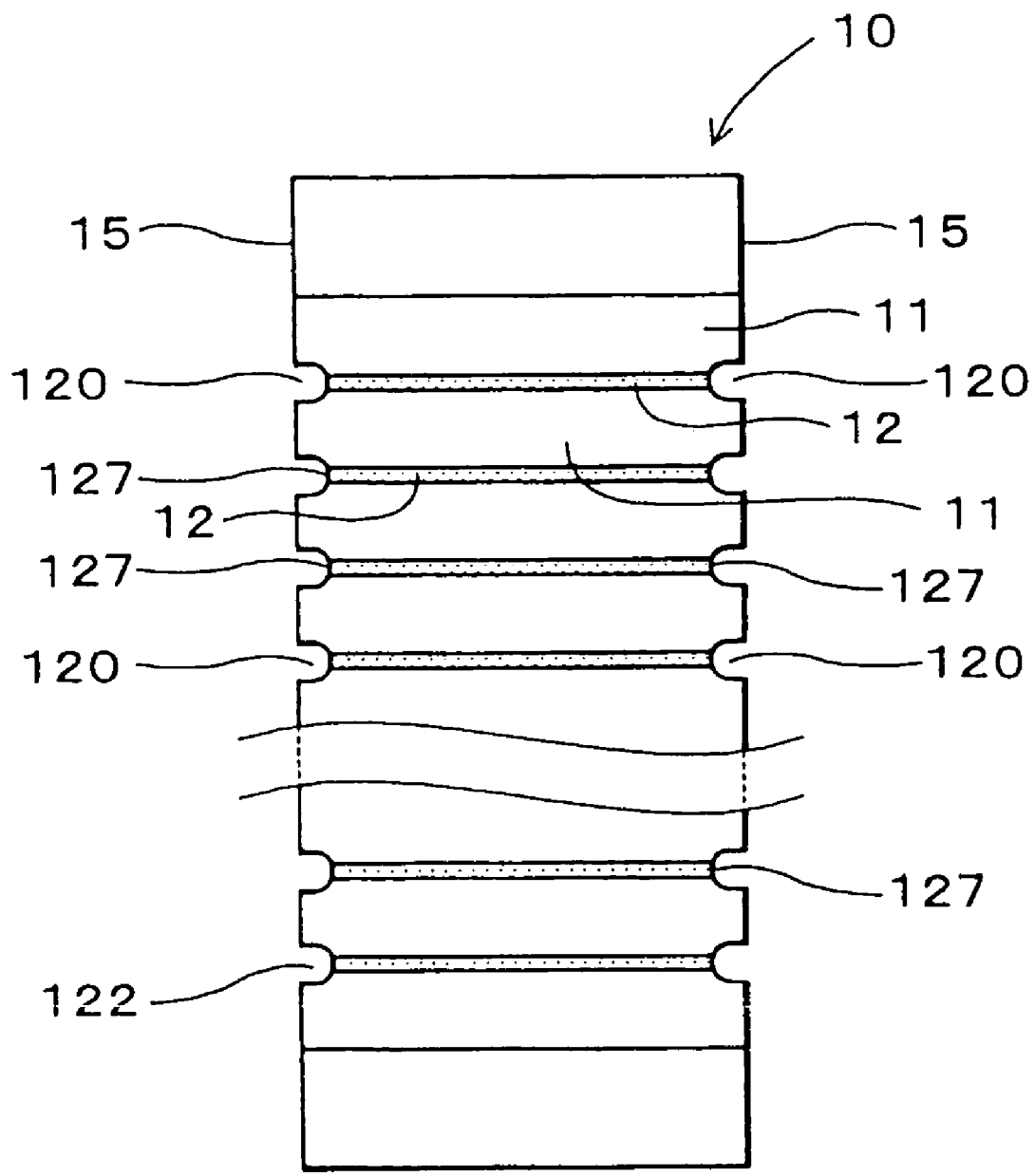
FIG. 7 is a sectional view showing a sectional structure of the ceramic laminated body in Embodiment 1 of the present invention.
Figure 8:
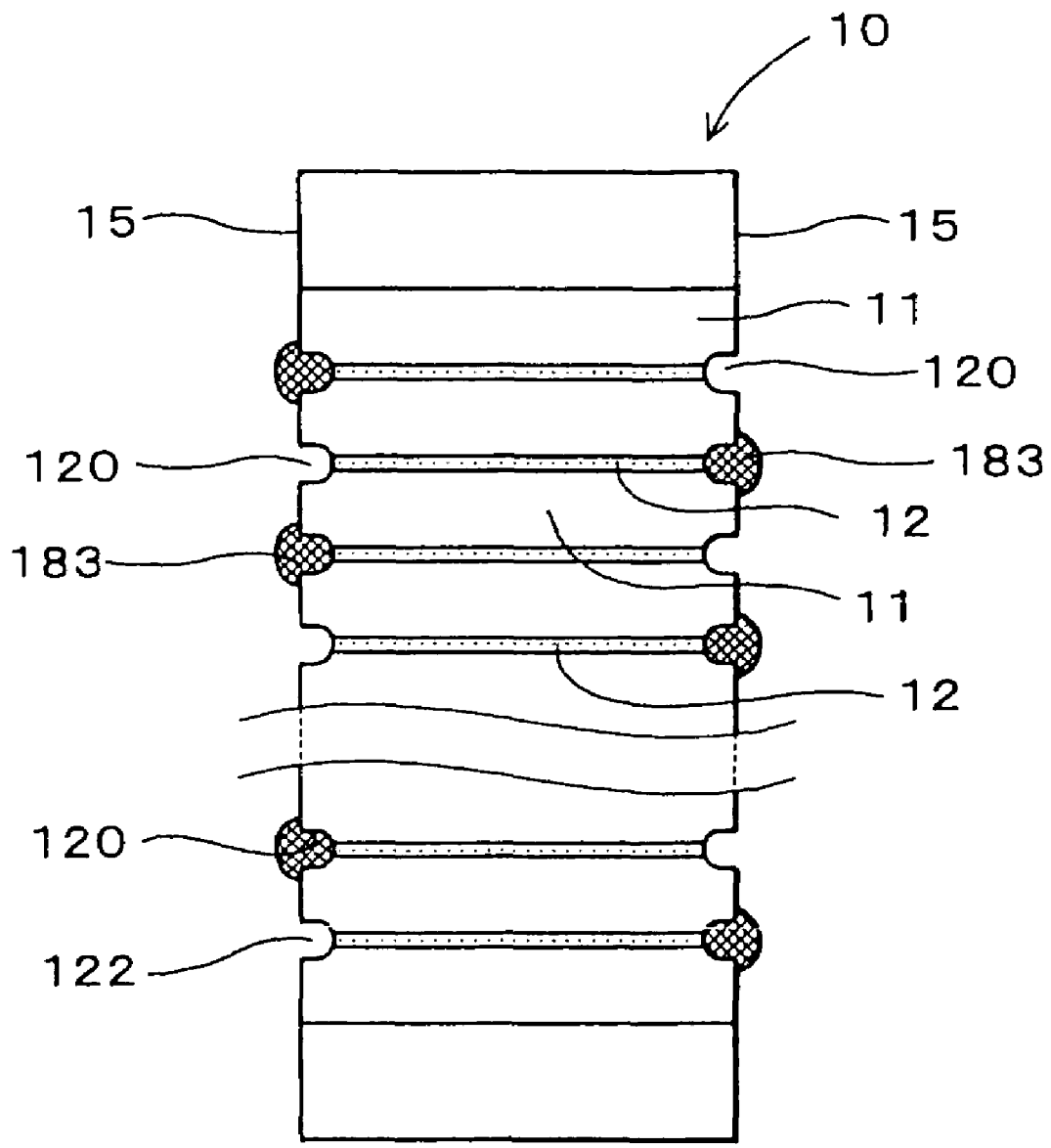
FIG. 8 is a sectional view showing a sectional structure of the ceramic laminated body in which the conductive portion is formed in Embodiment 1 of the present invention.

As shown in FIG. 7, the outer circumferential groove portion 120 including the dent portion 122, which is dented inward, is made to come into contact from the outer circumferential face of the ceramic laminated body 10 with the outer circumferential end portion 127 of each inner electrode layer 12 of the ceramic laminated body 10.

As shown in FIG. 10, the depth of the dent portion 122 from the outer circumferential face of the ceramic laminated body 10 is not constant. Therefore, the protruding portion 121, which protrudes from the periphery, is formed in the outer circumferential groove portion 120.

As shown in FIG. 10, the insulating portion 181 made of insulating material is formed in the outer circumferential groove portion 120 provided on the outer circumferential face of the ceramic laminated body 10 except the joining face 15.

As shown in FIG. 9, in the outer circumferential groove portion 120 formed on the joining face 15, the insulating portion 181 and the conductive portion 183 made of conductive material are alternately laminated on each other.

As shown in FIG. 9, in the outer circumferential groove portion 120 in which the insulating portion 181 is formed on one joining face 15, the conductive portion 183 is formed on the other joining face 15. Further, in the outer circumferential groove portion 120 in which the conductive portion 183 is formed on one joining face 15, the insulating portion 181 is formed on the other joining face 15.

In this connection, in the lamination-type piezoelectric element 1 of this embodiment, the baking electrode made of baking silver was used for the above conductive portion 183.

Figure 5:
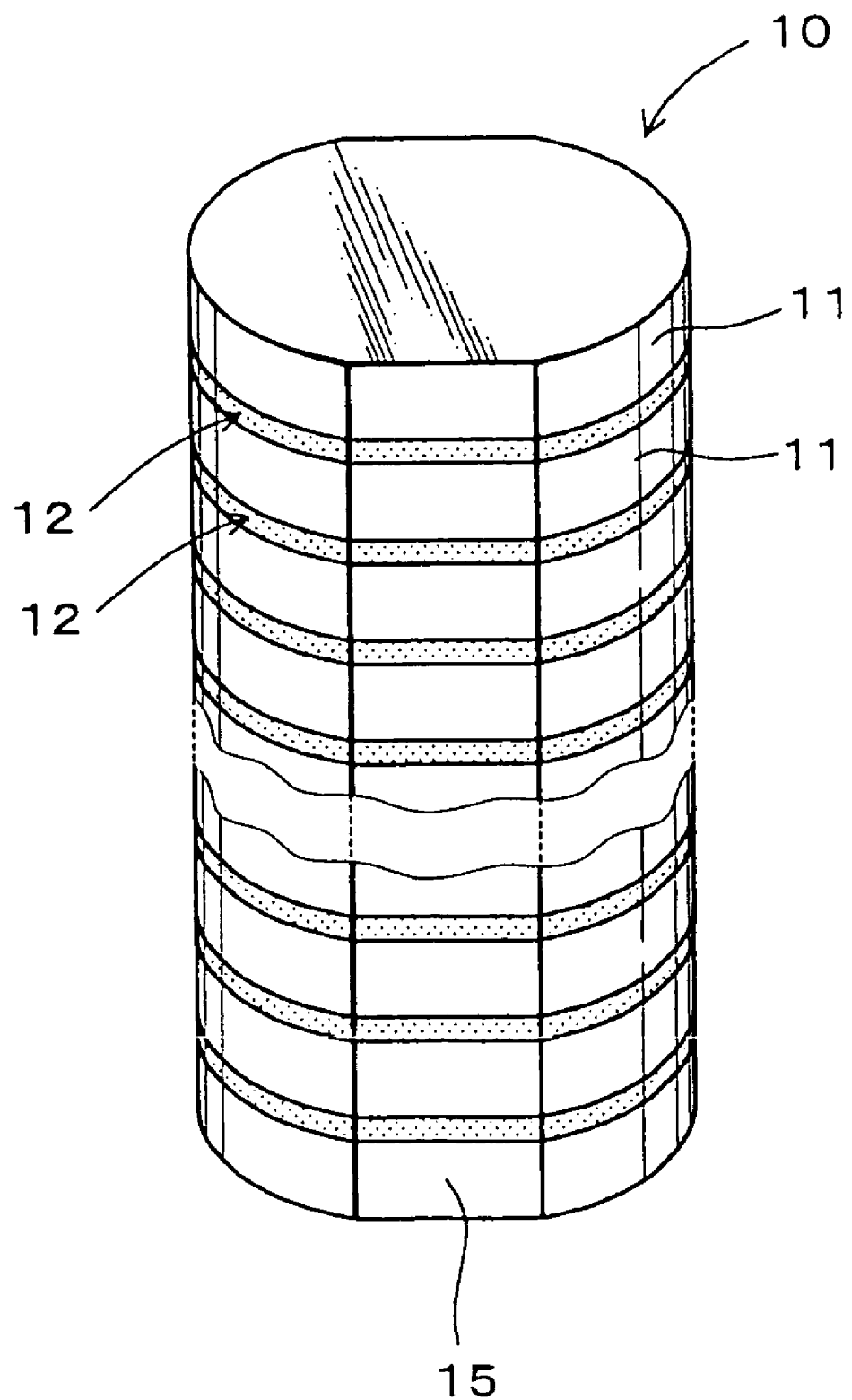
FIG. 5 is a perspective view showing a ceramic laminated body before conducting laser beam machining in Embodiment 1 of the present invention.

In this connection, as shown in FIG. 5, the ceramic laminated body 10 of this embodiment has a joining face 15 which is a plane parallel in the axial direction and opposed, and the cross-sectional shape of the ceramic laminated body 10 is barreled. However, the cross-sectional shape of the ceramic laminated body 10 is not limited to a barrel shape. According to the circumstances of use, the cross-sectional shape of the ceramic laminated body 10 may be changed to a polygon such as a square.

Figure 2:
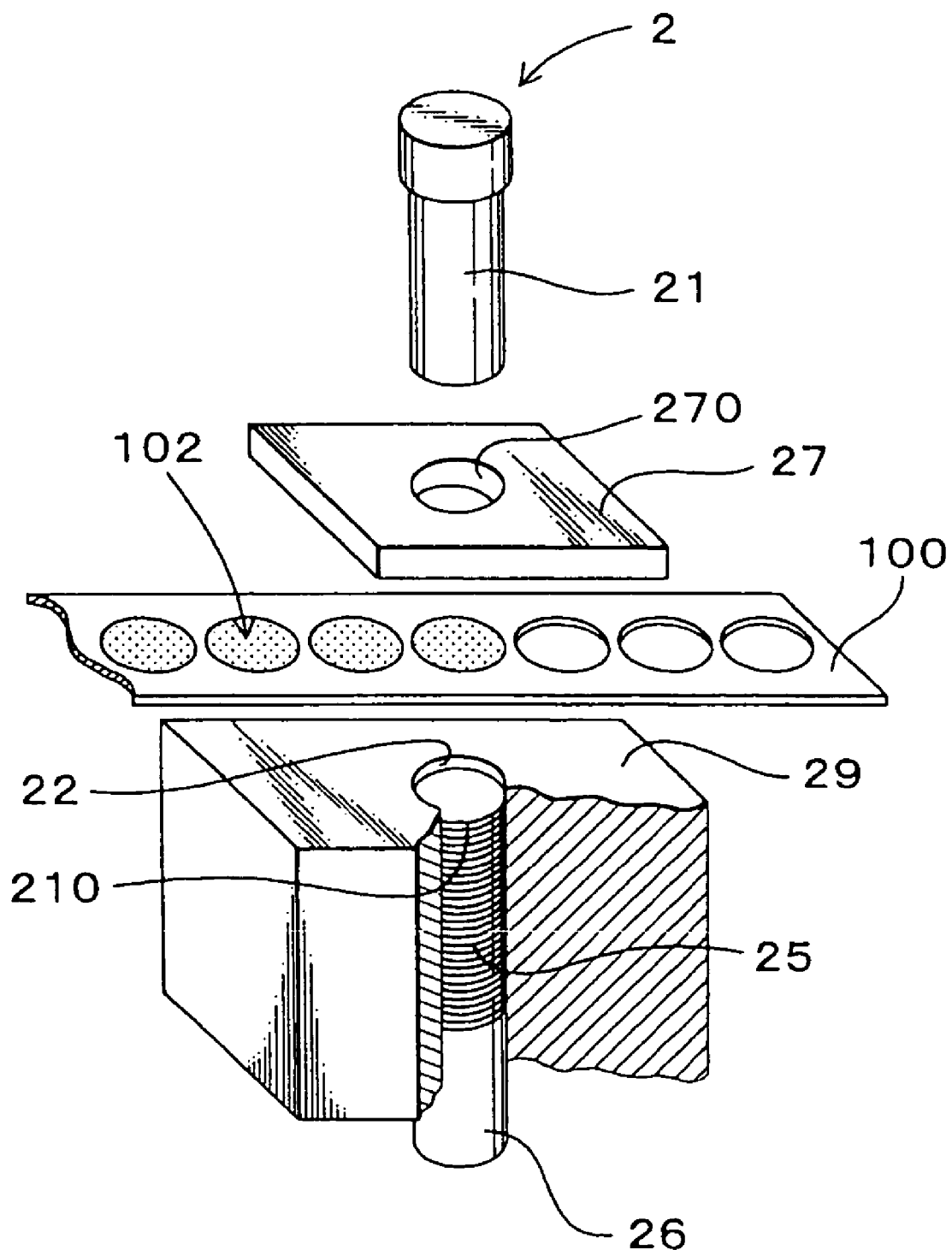
FIG. 2 is a schematic illustration showing a punching and laminating device in Embodiment 1 of the present invention.
Figure 6:
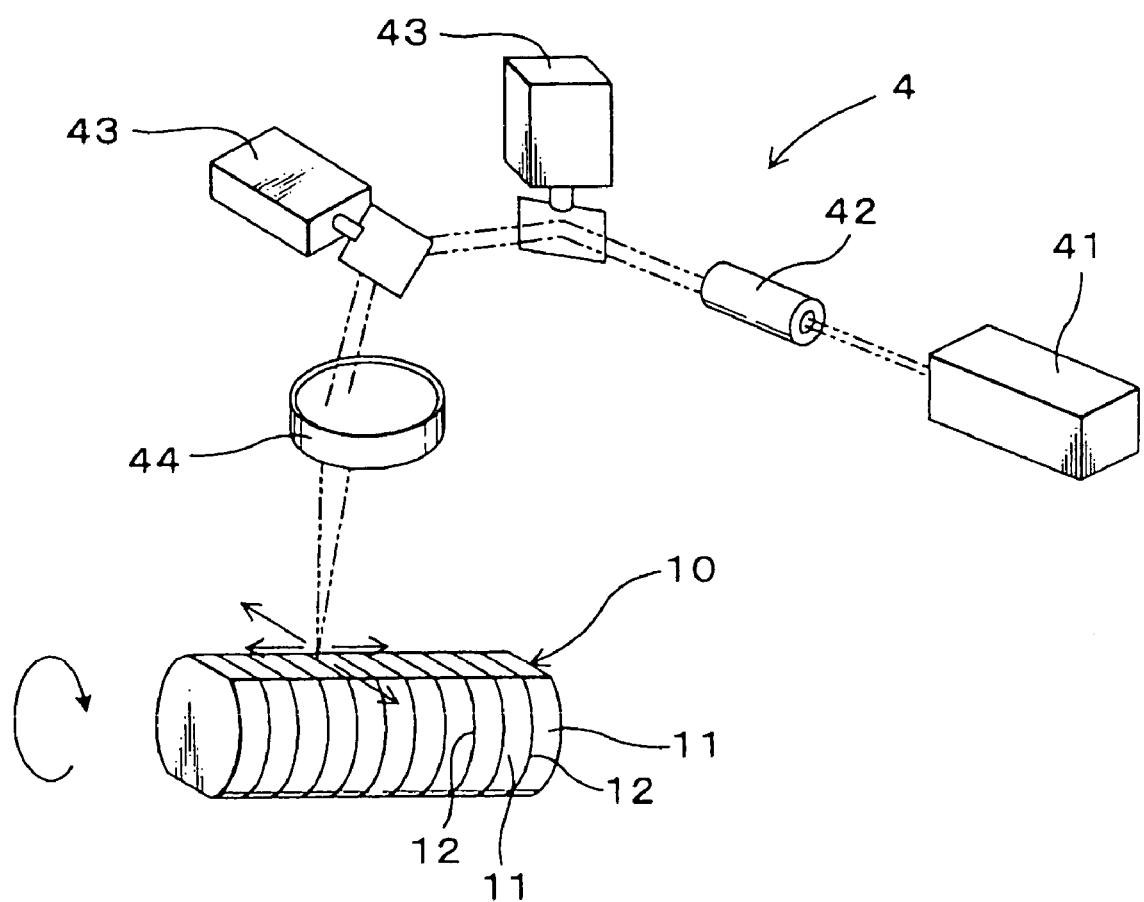
FIG. 6 is a schematic illustration showing a laser beam machine in Embodiment 1 of the present invention.

In this embodiment, in the case of manufacturing the above lamination-type piezoelectric element 1, the manufacturing apparatus, which included the printer 3, the punching laminating device 2, the baking furnace not shown and the dispenser device, was used as shown in FIGS. 1 and 2. Further, when the outer circumferential groove portion 120 was formed on the outer circumferential face of the ceramic laminated body 10 after the completion of baking, the $CO_2$ laser beam machine 4 was used as shown in FIG. 6.

In order to manufacture the lamination-type piezoelectric element 1 of this embodiment, first, the ceramic laminated body 10 is made. The laminated body forming step of making the ceramic laminated body 10 includes a green sheet making step, printing step, punching step, laminating step and baking step.

In this connection, as shown in FIG. 2, the punching and laminating device 2 used in the step of this embodiment is composed so that the punching step and the laminating step can be simultaneously executed.

First of all, in the green sheet making step, as shown in FIG. 1, the green sheet 100 is made from slurry for the green sheet which is material for making the piezoelectric element.

In this case, this slurry is made in such a manner that binder and a minute quantity of plasticizer and antifoaming agent are added to ceramic material made of piezoelectric ceramics such as titanate lead zirconate (PZT) and then dispersed in organic solvent.

In this embodiment, when the above slurry was coated on a carrier film, which is not shown, by the doctor blade method, the green sheet 100 of 100 $\mu$m thickness was generated. Concerning the method of generating the green sheet 100 from slurry, excepting the method of using a doctor blade, it is possible to adopt a method of extrusion and various other methods.

Next, in the printing step, as shown in FIG. 1, on the entire face of the region which becomes the lamination face 101 on the green sheet 100, Ag—Pd paste, which becomes the inner electrode layer 12 by baking, is coated with the silk plate 106 for screen printing so as to form the printing pattern 102 for the electrode.

Figure 4:
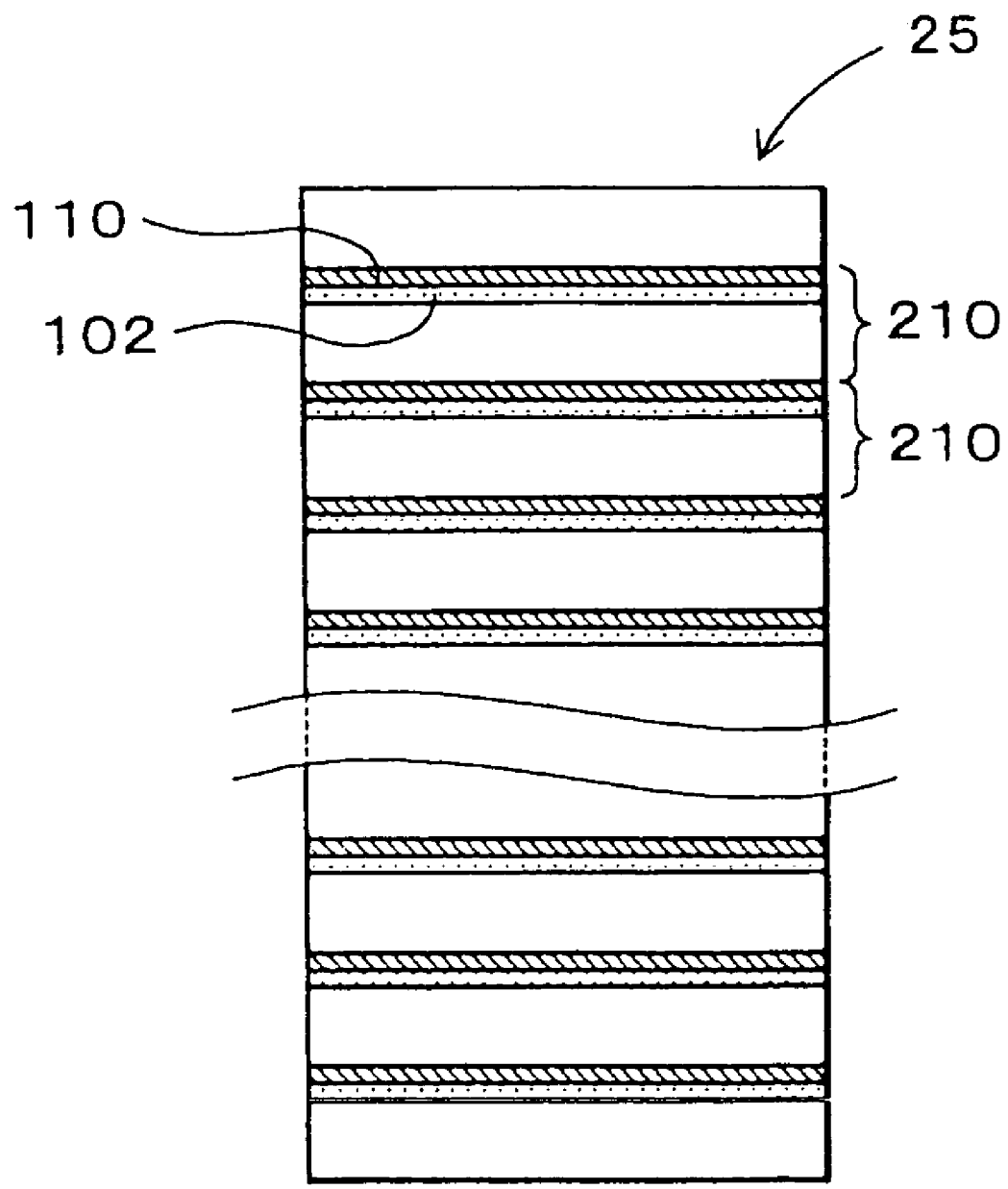
FIG. 4 is a sectional view showing a sectional structure of the intermediate body in Embodiment 1 of the present invention.

Further, in this embodiment, as an adhesive agent for laminating the sheet piece 210, slurry containing substantially the same ceramic material as the ceramic material composing the green sheet 100 is coated on the entire face of the lamination face 101 so as to form the adhesive layer 110 shown in FIG. 4.

Figure 3:
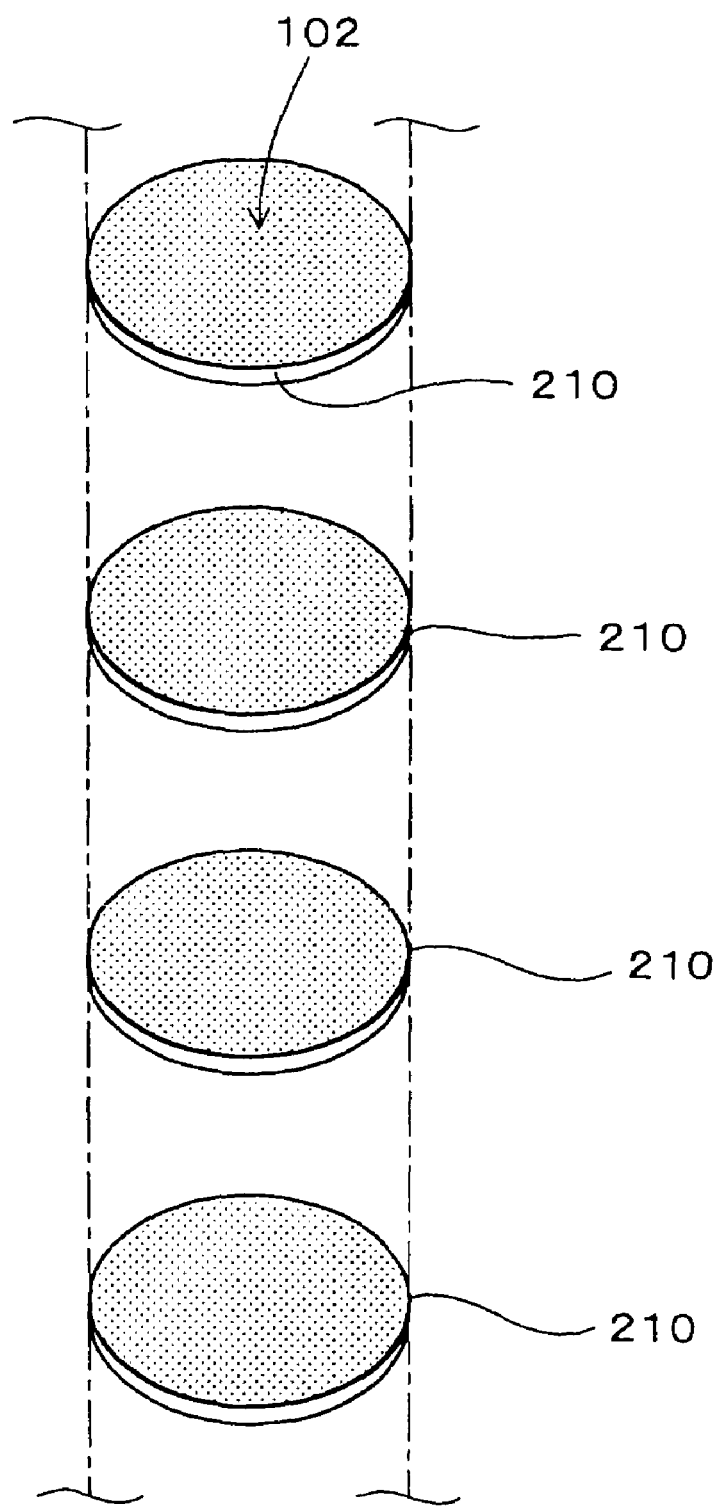
FIG. 3 is a schematic illustration showing a lamination structure of the intermediate body in Embodiment 1 of the present invention.

Next, the punching and laminating of the sheet piece 210 are conducted in parallel by the above punching and laminating device 2. In this case, as shown in FIGS. 2 to 4, the sheet pieces 210 are punched from the green sheet 100, and these sheet pieces 210 are successively laminated on each other so that the intermediate body 25 can be made.

In this case, the structure and operation of the punching and laminating device 2 of this embodiment will be explained below. As described above, the punching and laminating device 2 shown in FIG. 2 is a device composed so that the punching and laminating of the sheet piece 210 can be executed in parallel.

This punching and laminating device 2 includes: a hollow lamination holder 29 having a lamination hole 22 inside; and a punch 21 which strokes toward the lamination holder 29 by a hydraulic cylinder (not shown).

In the lamination hole 22 of the lamination holder 29, the guide 26 is arranged which has a suction mechanism (not shown) composed of a suction hole which opens to the lower end face. The intermediate body 25 laminated in the lamination hole 22 can be sucked and held by the suction mechanism of this guide 26.

When the intermediate body 25 is made by the punching and laminating device 2 composed as described above, first, the green sheet 100 is fed by a predetermined distance so that the printing pattern 102 for the electrode can be made to align with the punching position of the punch 21.

After that, while the green sheet 100 is being held by the presser plate 27, the punch 21 is stroked toward the lamination holder 29. Then, the punch 21 is made to penetrate the through-hole 270 on the presser plate 27 and inserted into the lamination hole 22. In this way, the sheet piece 210 is punched and laminated inside the lamination hole 22. The series of motions are repeatedly executed.

In the first punching motion in the series of motions, the sheet piece 26 is sucked onto the upper face of the suction mechanism of the guide 26 and accommodated in the lamination layer hole 22.

Further, the sheet piece 210 having the printing pattern 102 for the electrode on the green sheet 100 is successively punched by the above series of motions. The thus punched sheet pieces 210 are successively bonded to each other by the adhesive layer 110 (shown in FIG. 4) provided on the surface of the sheet piece 210. The thus laminated sheet pieces 210 compose one layer of the intermediate body 25.

At this time, the lamination holder 29 gradually goes downward according to the length of the intermediate body 25 while the lamination holder 29 is sucking and holding the lower end face of the intermediate body 25. Therefore, the upper end face of the intermediate body 25 is kept at a substantially constant position in the punching and laminating device 2. Accordingly, the newly punched sheet piece 210 can be bonded by a constant intensity of force.

At the final punching motion in the series of motions, the green sheet piece, on which the printing pattern 102 for the electrode is not formed, is punched and laminated on an upper end face of the intermediate body 25.

In this embodiment, by the above series of motions, the intermediate body 25, in which 300 sheet pieces 210 were laminated, was made.

Next, this intermediate body 25 is baked in the baking step, and a baked body (not shown) is made. In the baking step of this embodiment, baking was executed in a baking furnace not shown in the drawing, and the intermediate body 25 was kept at 1200° C. of the furnace temperature. After the completion of baking, the intermediate body 25 was cooled in the furnace.

In this case, Ag—Pd paste printed on the surface of the sheet piece 210 is baked and formed into the inner electrode layer 12.

In this embodiment, the outer circumferential face of the above baked body was machined. In this case, as shown in FIG. 5, the outer circumferential face of the baked body was machined by a machine tool not shown. After that, two sides on the outer circumferential face, which were opposed to each other, were subjected to flattening so that the two sides could be formed into a plane. In this way, the ceramic laminated body 10 having the joining face 15 was made.

In this embodiment, flattening was conducted in such a manner that the sides of the ceramic laminated body 10, which were opposed to each other, were polished to the surface roughness of 100 $\mu$m, so that the joining face 19 to which the external electrode 18 was joined could be formed.

In this connection, in order to make the ceramic laminated body 10, the cross-sectional shape of which is barreled, it is possible to laminate a sheet piece which has previously been cut out into a barrel shape. In this case, flattening conducted in this embodiment to form the joining face 15 can be omitted. Therefore, the lamination-type piezoelectric element can be more effectively manufactured.

Next, as shown in FIG. 6, the groove forming step is executed by means of laser beam machining in which a laser beam is irradiated onto the outer circumferential face of the ceramic laminated body 10. In this step, each inner electrode layer 12 exposed to the outer circumferential face of the ceramic laminated body is irradiated with a laser beam so as to machine the dent portion 122 and form the outer circumferential groove portion 120.

In this case, the structure and operation of the laser beam machine 4 used in this embodiment will be explained below.

As shown in FIG. 6, this laser beam machine 4 includes: a $CO_2$ laser beam generator 41 for emitting an infrared ray laser beam, the wave-length of which is 10.6 $\mu$m; a beam expander 42 for expanding the laser beam; two galvanometers 43 for controlling the laser beam direction; and a condenser lens 44 for condensing the laser beam.

A mounting table (not shown) has a rotating mechanism for rotating the ceramic laminated body 10, which is mounted on the mounting table, around the axis thereof, that is, the mounting table is composed so that it can pivotally hold the ceramic laminated body 10.

The $CO_2$ laser beam generator 41 of this embodiment is an RF excitation diffusion cooling slab type laser beam generator. This $CO_2$ laser beam generator 41 is characterized in that the output can rise very quickly.

The condenser lens 44 can condense a laser beam emitted from the $CO_2$ laser beam generator 41 to a beam spot of 40 $\mu$m diameter.

Two galvanometers 43 can move an irradiating position of the laser beam in two axial directions substantially perpendicular to each other.

In this embodiment, when the laser beam is irradiated to the outer circumferential face of the ceramic laminated body 10, rotation of the ceramic laminated body 10 is controlled by the rotating mechanism arranged on the mounting table, and the laser beam direction is changed by the galvanometers 43, so that each position on the outer circumferential face of the ceramic laminated body 10 can be machined.

In this connection, the laser beam machine 4 is composed so that laser beam machining can be conducted while air functioning as an assist gas is being blown to the laser beam irradiating portion.

In this case, while the laser beam irradiating position is being moved along the outer circumferential face of the ceramic laminated body 10, a pulse-shaped laser beam is irradiated in a constant cycle by the $CO_2$ laser beam generator 41 which is subjected to ON-OFF control. In this way, the machined hole 123 was formed one by one when one shot of the laser beam was irradiated.

In this embodiment, moving speed of the laser beam irradiating position was set so that the ON-OFF control cycle could be executed 760 times while the laser beam was making one revolution on the outer circumference of the ceramic laminated body 10. The machined hole 123, which was recessed into a bowl shape from the outer circumferential face of the ceramic laminated body 10, was formed by one shot of the laser beam in one cycle. In this way, 760 machined holes 123 were machined along the inner electrode layer 12.

In this embodiment, by utilizing the characteristic of the $CO_2$ laser in which the output can rise in a very short period of time, the ratio of the laser beam irradiating time in the cycle period is set at a very low value, that is, the ratio of the laser beam irradiating time in the cycle period is set at 1%. Therefore, the machined hole 123 can be accurately formed in the circumferential direction. Therefore, blur in the circumferential direction is small and the positional accuracy is high.

As shown in FIG. 10, according to the above groove forming step, the machined holes 123, which are adjacent to each other, overlap with each other in the circumferential direction and compose the dent portions 122 of one body. In the middle portion between the machined holes 123 adjacent to each other, the protruding portion 121, the depth of which is smaller than that of the machined hole 123, is formed. That is, the outer circumferential groove portion 120, in which the protruding portion 121 repeatedly appears, is formed on the outer circumference of the inner electrode layer 12.

Instead of ON-OFF control of this embodiment, the outer circumferential groove portion 120 of this embodiment can be formed by the laser beam which has been subjected to duty control.

In this case, the laser beam is duty-controlled by the duty frequency, the speed of which is sufficiently higher than that of the cycle period of the aforementioned ON-OFF control. The duty ratio of the laser beam is changed step-wise by the substantially same cycle period as that of the aforementioned ON-OFF control. The duty ratio of a predetermined value is set corresponding to one shot period of the laser beam, and the duty ratio is set at zero in the period excepting that.

That is, in the duty control, a plurality of pulse-shaped laser beams are irradiated in the period in which one shot of the laser beam is irradiated in the aforementioned ON-OFF control.

The duty ratio in the duty control may be smoothly changed. In this case, when laser beam irradiating energy is smoothly changed along the outer circumference of the inner electrode layer 12, the outer circumferential groove portion, the depth from the outer circumferential face of which is smoothly increased and decreased, can be formed.

In order to accomplish manufacturing the lamination-type piezoelectric element 1 with the ceramic laminated body 10 in which the outer circumferential groove portion 120 is formed as described above, as shown in FIG. 10, after the embedding step has been executed in which the insulating portion 181 and the conductive portion 183 are formed in the outer circumferential groove portion 120, a pair of outer electrodes 18 are joined to the joining faces 15 of the ceramic laminated body 10.

In this connection, in this embodiment, the insulating portion 181 and the conductive portion 183 are formed so that the dent portion 122 of the outer circumferential groove portion 120 can be embedded and further the protruding portion 121 can be covered.

As shown in FIG. 9, in this embedding step, the insulating portion 181 made of insulating material is formed in the outer circumferential groove portion 120 excepting the joining face 15 of the ceramic laminated body 10 and in the outer circumferential groove portion 120 on every other joining face 15, so that the insulating property of the outer circumference of the ceramic laminated body 10 can be ensured.

In this connection, in this embodiment, in the outer circumferential groove portion 120 in which the insulating portion 181 is formed on one joining face 15, the insulating portion 181 is not formed on the other joining face 15, and in the outer circumferential groove portion 120 in which the insulating portion 181 is not formed on one joining face 15, the insulating portion 181 is formed on the other joining face 15.

Further, in the outer circumferential groove portion 120 in which the insulating portion 181 is not formed on every other layer on the joining face 15, a baking electrode made of baking silver was used for the above conductive portion 183.

In this connection, after the conductive portion 183 has been formed, the outer circumferential groove portion 120 composing the insulating portion 181 may be formed and the insulating portion 181 may be formed in the outer circumferential groove portion 120. In this case, there is no possibility that the outer circumferential groove portion 120 forming the insulating portion 181 is deformed by the heat generated when the baking electrode of the conductive portion 183 is formed.

The insulating portion 181 was formed by a dispenser device not shown in the drawing. This dispenser device is composed in such a manner that a predetermined quantity of liquid insulating material is discharged from a dispense nozzle, the position of which is controlled.

In this embodiment, the insulating portion 181 was formed from the insulating material (for example, Three-Bond 1230 manufactured by Three-Bond Co., Ltd.) made of a silicon potting agent with this dispenser device.

Concerning the insulating material, it is possible to use resin, glass or ceramics excepting the above insulating material.

Instead of the dispenser device of this embodiment, it is possible to use a printer device in which insulating material is coated by means of ink-jet or a plotter device in which insulating material is coated by a touch-pen.

A baking electrode 183 provided in the outer circumferential groove portion 120 was formed by means of coating with the dispenser device.

Further, as shown in FIG. 10, the lamination-type piezoelectric element 1 is made in which the outer electrode 18 is joined to the joining face 15 of the ceramic laminated body 10 via the baking electrode 183 and every other inner electrode layer 12 and outer electrode 18 are electrically connected to each other.

As described above, in the ceramic laminated body 10 composing the lamination-type piezoelectric element 1 of this embodiment, the outer circumferential groove portion 120 is formed so that it can be contacted with the outer circumferential end portion 127 of the inner electrode layer 12.

The insulating layer 181 is formed on every other inner electrode layer 12 on the joining face 15, and a conductive portion 183 composed of the baking electrode is joined to the inner electrode 12 on every other layer on which the insulating portion 181 not formed. Further, the insulating layer 181 is formed in the outer circumferential groove portion 120 on the outer circumference excepting the joining face 15 in the ceramic laminated body 10.

In this lamination-type piezoelectric element 1, the conductive portion 183 and the insulating portion 181 bite into the outer circumference of the ceramic laminated body 10. Therefore, the contact area of the ceramic laminated body 10 with the conductive portion 183 or the insulating portion 181 is increased. At the same time, the joining strength between them can be enhanced by the so-called wedge effect.

As described above, a plurality of protruding portions 121 protruding from the periphery are formed in the outer circumferential groove portion 120.

Therefore, the protruding portions 121 bite wedge-wise into the insulating portion 181 and the conductive portion 183 formed in the outer circumferential groove portion 120. Therefore, the insulating portion 181 and the conductive portion 183 are more strongly joined to each other by the wedge effect exhibited by the protruding portions 121.

As described above, the surface of the outer circumferential groove portion 120 is formed into a rising and falling curved face. A curved face is formed on the contact surface of the insulating portion 181 with the conductive portion 183 formed along the surface of the outer circumferential groove portion 120.

Therefore, stress generated in the insulating portion 181 and the conductive portion 183 by the expansion and contraction of the lamination-type piezoelectric element 1 seldom concentrates upon one point on the contact surface of the insulating portion 181 of the conductive portion 183. Accordingly, stress diffuses on the contact surface which is a curved face. Therefore, problems such as cracks and others are seldom caused in the insulating portion 181 and the conductive portion 183 formed in the outer circumferential groove portion 120.

As described above, in the lamination-type piezoelectric element 1 of this embodiment, peeling of the insulating portion 181 and the conductive portion 183 provided in the inner electrode layer 12 is seldom caused even when it is used over a long period of time, and an electrical leakage is seldom caused inside.

Figure 11:
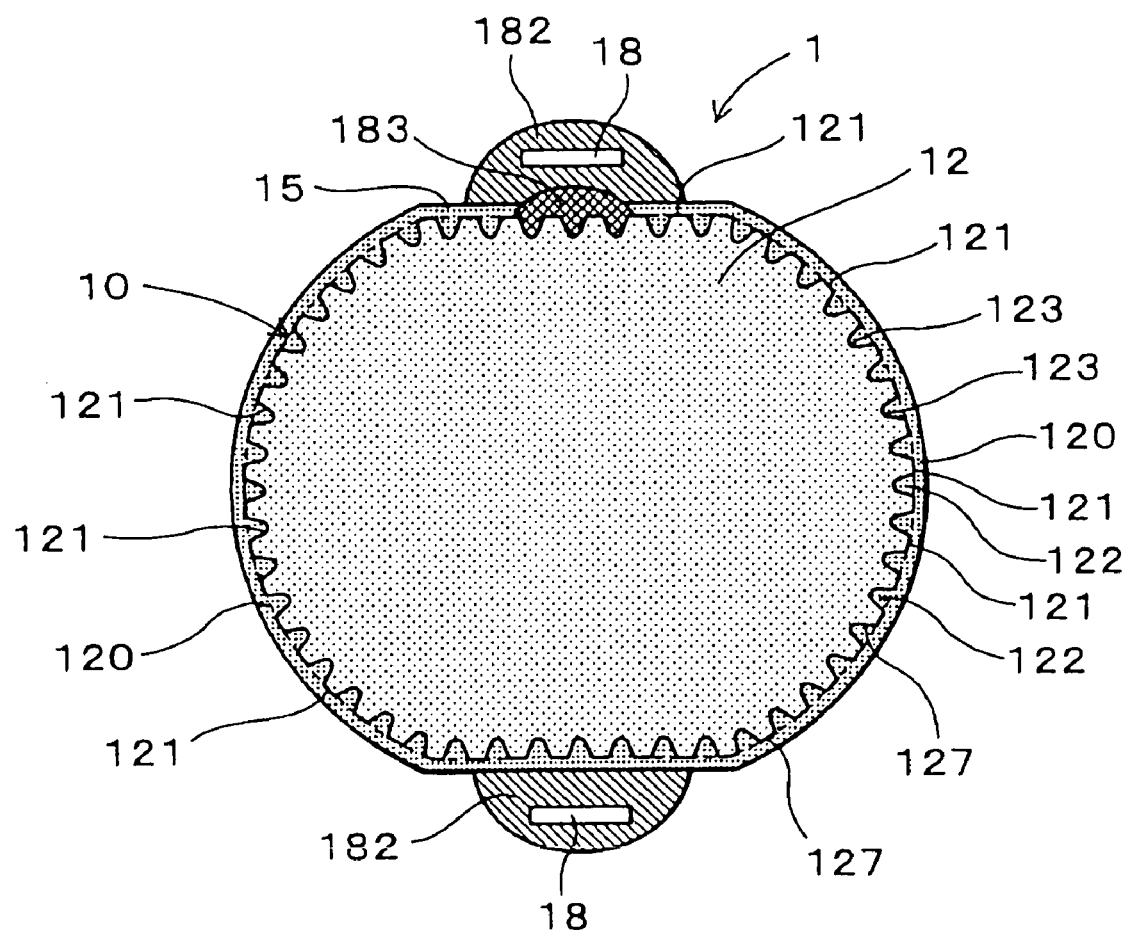
FIG. 11 is a sectional view showing a sectional structure of another lamination-type piezoelectric element along the inner electrode layer in Embodiment 1 of the present invention.

In this connection, in this embodiment, the outer circumferential groove portion 120 is formed so that the machined holes 123, which are adjacent to each other, can compose the dent portion 122 of one body. However, instead of that, as shown in FIG. 11, a plurality of independent machined holes 123 may be formed along the inner electrode layer 12, and the outer circumferential groove portion 120 including a plurality of independent dent portions 122 may be formed. In this case, the outer circumferential face of the ceramic laminated body 10 between the dent portions 122 forms the aforementioned protruding portion 121.

Figure 12:
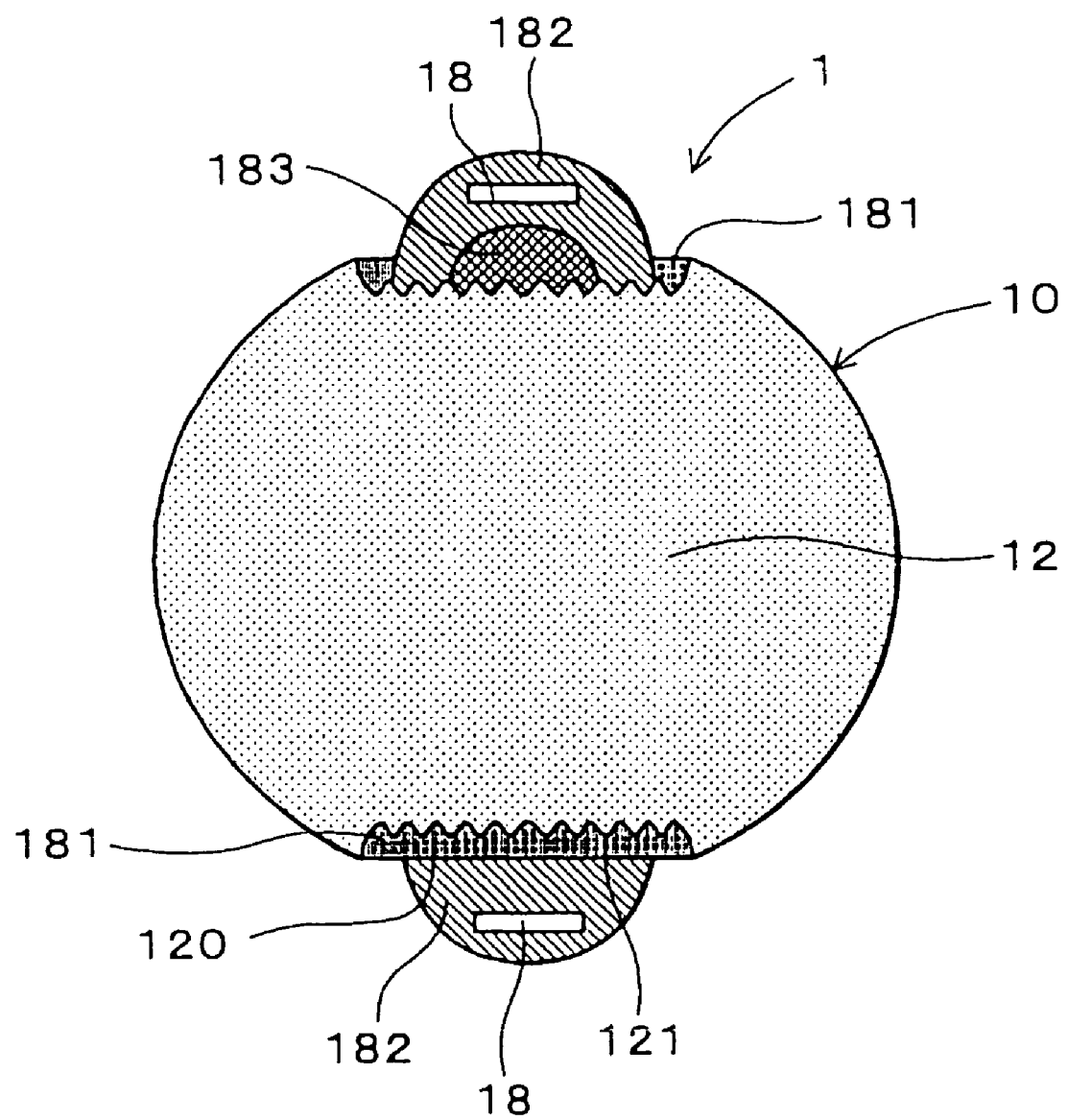
FIG. 12 is a sectional view showing a sectional structure of another lamination-type piezoelectric element along the inner electrode layer in Embodiment 1 of the present invention.

As shown in FIG. 12, the outer circumferential groove portion 120 can be formed only on the joining face 15 on the outer circumferential face of the ceramic laminated body 10.

Figure 13:
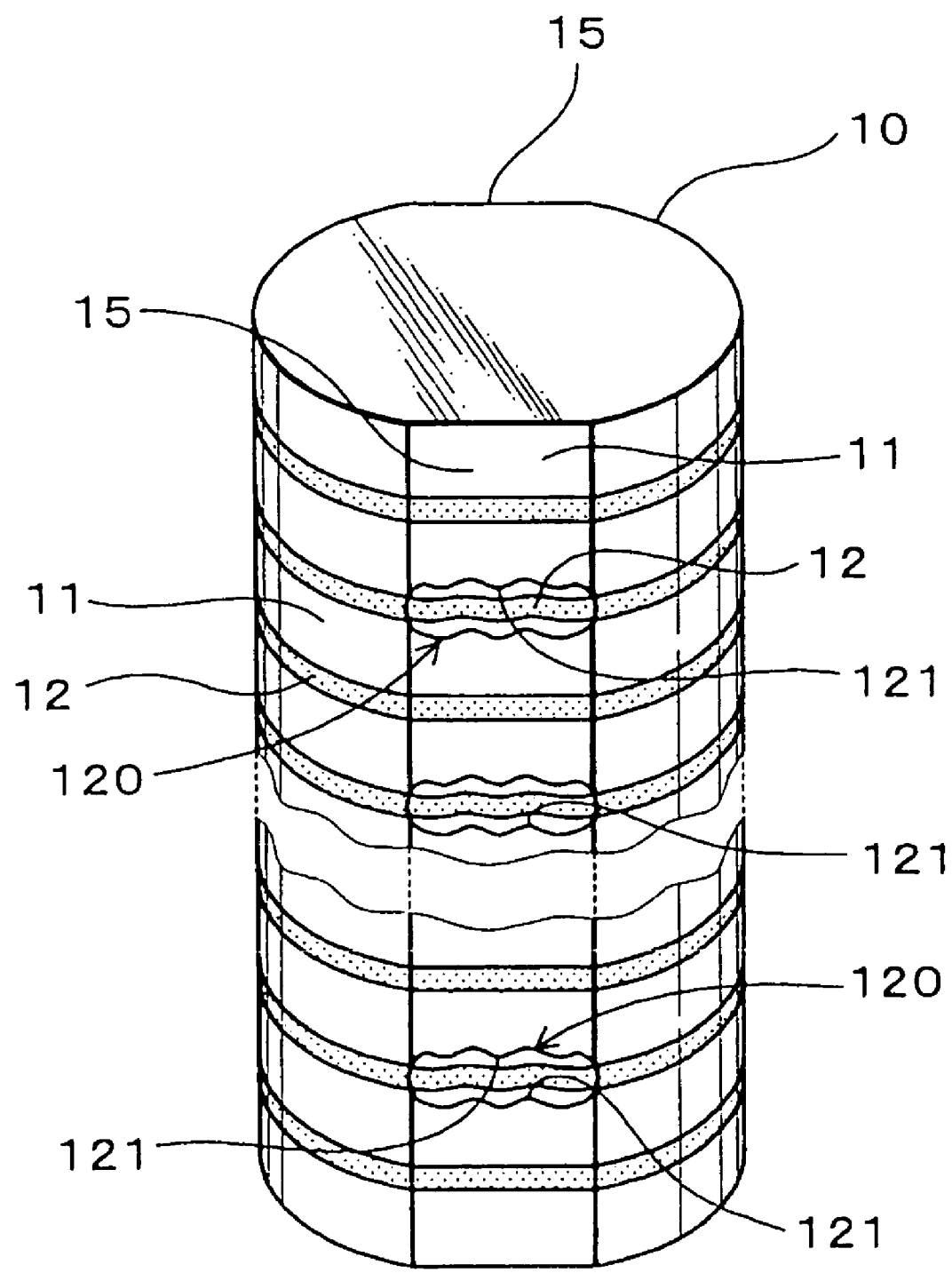
FIG. 13 is a perspective view showing another ceramic laminated body in Embodiment 1 of the present invention.

Further, instead of the outer circumferential groove portion 120 shown in FIG. 12, as shown in FIG. 13, the outer circumferential groove portion 120 may be formed in which the laser beam irradiating position on the outer circumferential face of the ceramic laminated body 10 extends zigzag fluctuating in the laminating direction around the inner electrode layer 12.

In this case, the protruding portion 121 protruding in the laminating direction of the ceramic laminated body 10 can be formed.

Further, the laser beam irradiating position can be made to fluctuate in the laminating direction. At the same time, an intensity of irradiating energy can be made to fluctuate. In this case, it is possible to form an outer circumferential groove portion composed of an adjoining outer surface having a more complicated curved face.

Embodiment 2

In this embodiment, an arrangement of the outer circumferential groove portion on the joining face of the ceramic laminated body is changed.

Figure 14:
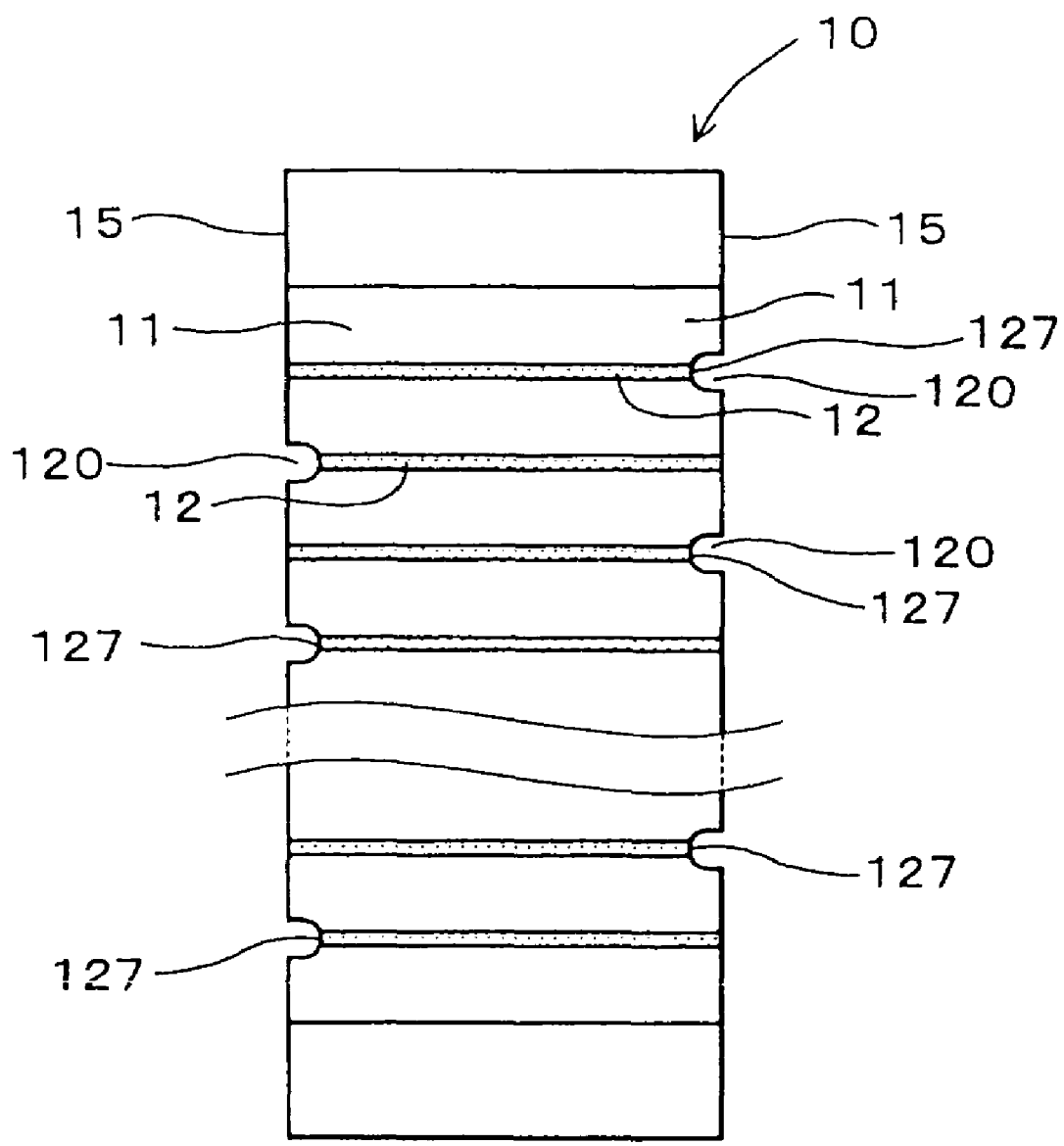
FIG. 14 is a sectional view showing a sectional structure of the ceramic laminated body in Embodiment 2 of the present invention.

As shown in FIG. 14, in the ceramic laminated body 10 composing the lamination-type piezoelectric element 1 of this embodiment, the outer circumferential groove portion 120 on the joining face 15 is formed so that it can come into contact with the outer circumferential end portion 127 on every other inner electrode layer 12.

As shown in the drawing, on the inner electrode layer 12, on one joining face 15 of which the outer circumferential groove portion 120 is formed, the outer circumferential groove portion 120 is not formed on the other joining face 15. On the inner electrode layer 12, on one joining face 15 of which the outer circumferential groove portion 120 is not formed, the outer circumferential groove portion 120 is formed on the other joining face 15.

In this connection, on the outer circumferential face excepting the joining face 15 in the ceramic laminated body 10, the outer circumferential groove portion 120 is formed along the inner electrode 12 in the same manner as that of Embodiment 1.

Figure 15:
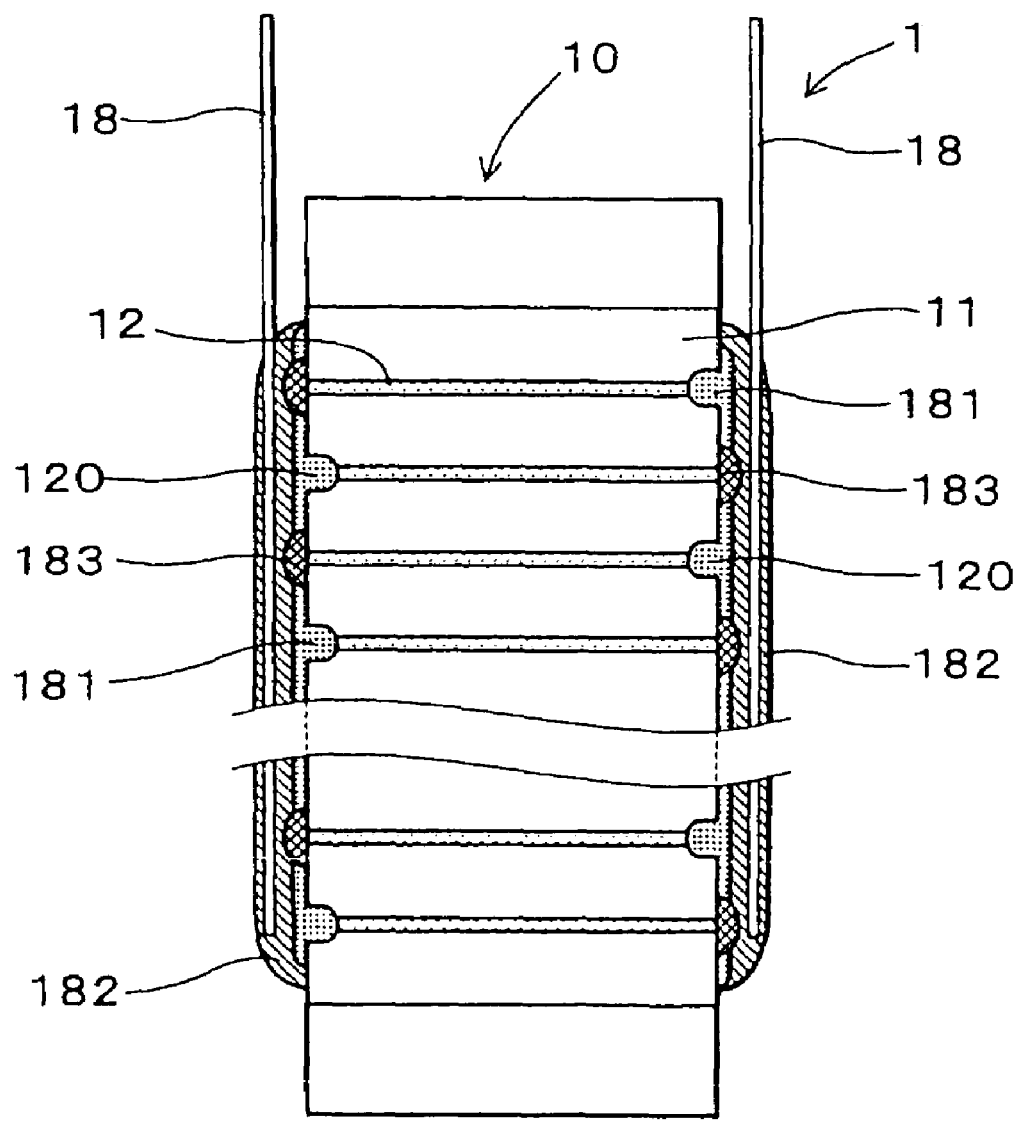
FIG. 15 is a sectional view showing a sectional structure of the lamination-type piezoelectric element in Embodiment 2 of the present invention.
Figure 16:
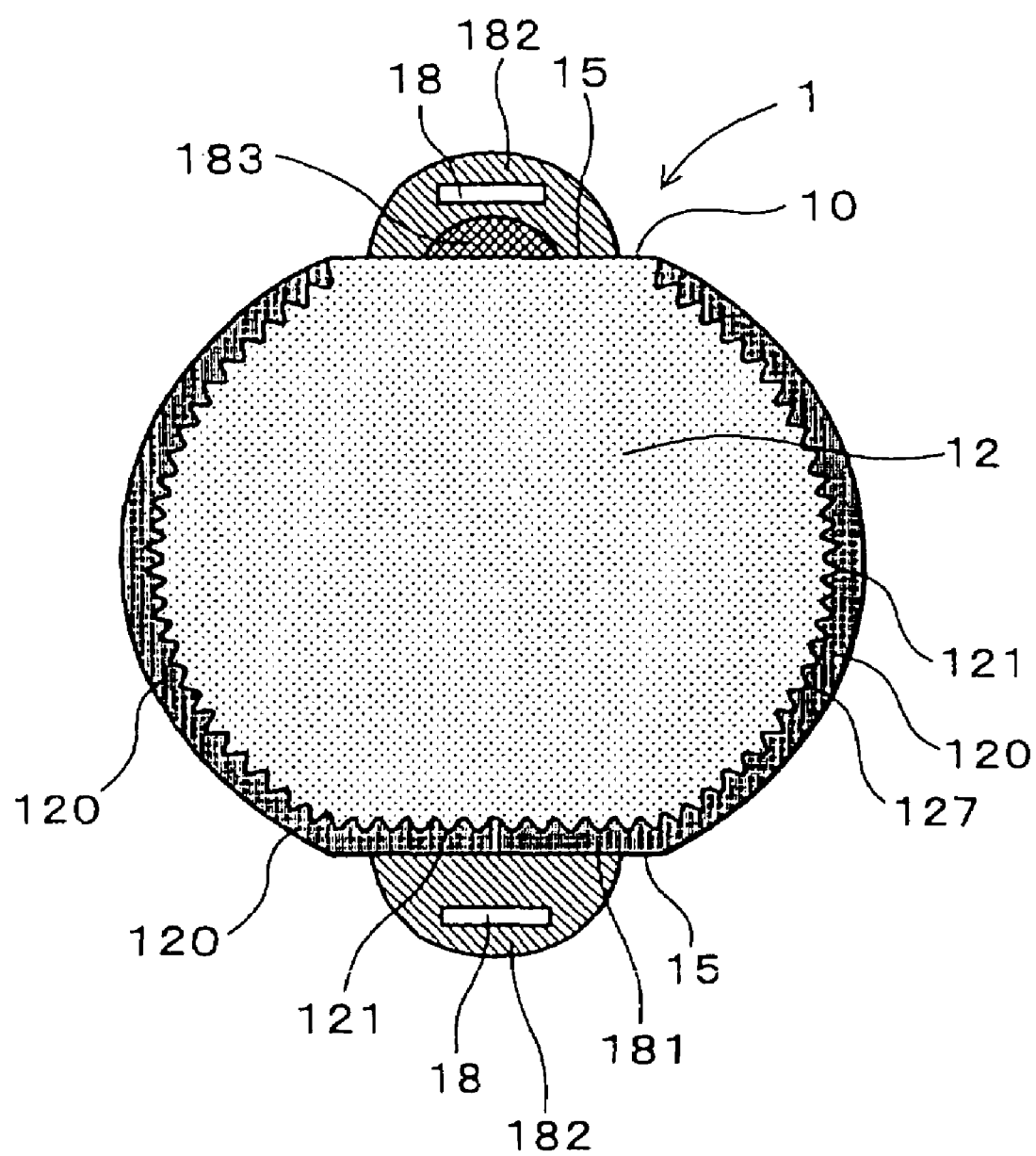
FIG. 16 is a sectional view showing a sectional structure of the lamination-type piezoelectric element along the inner electrode layer in Embodiment 2 of the present invention.

As shown in FIGS. 15 and 16, in all the outer circumferential groove portions 120 on the outer circumferential face of the ceramic laminated body 10, the insulating portion 181 is formed. Concerning the inner electrode layer 12 on which the insulating portion 181 is not formed on the joining face 15, a baking electrode is joined onto the outer circumferential face as the conductive portion 183.

Other points of the structure and operational effect are the same as those of Embodiment 1.

When the outer electrode 18 is joined onto the joining face 15 of the ceramic laminated body 10, the outer electrode 18 can be joined with the conductive adhesive such as Pb, Ag—Pb or Cu without using a baking electrode.

Figure 17:
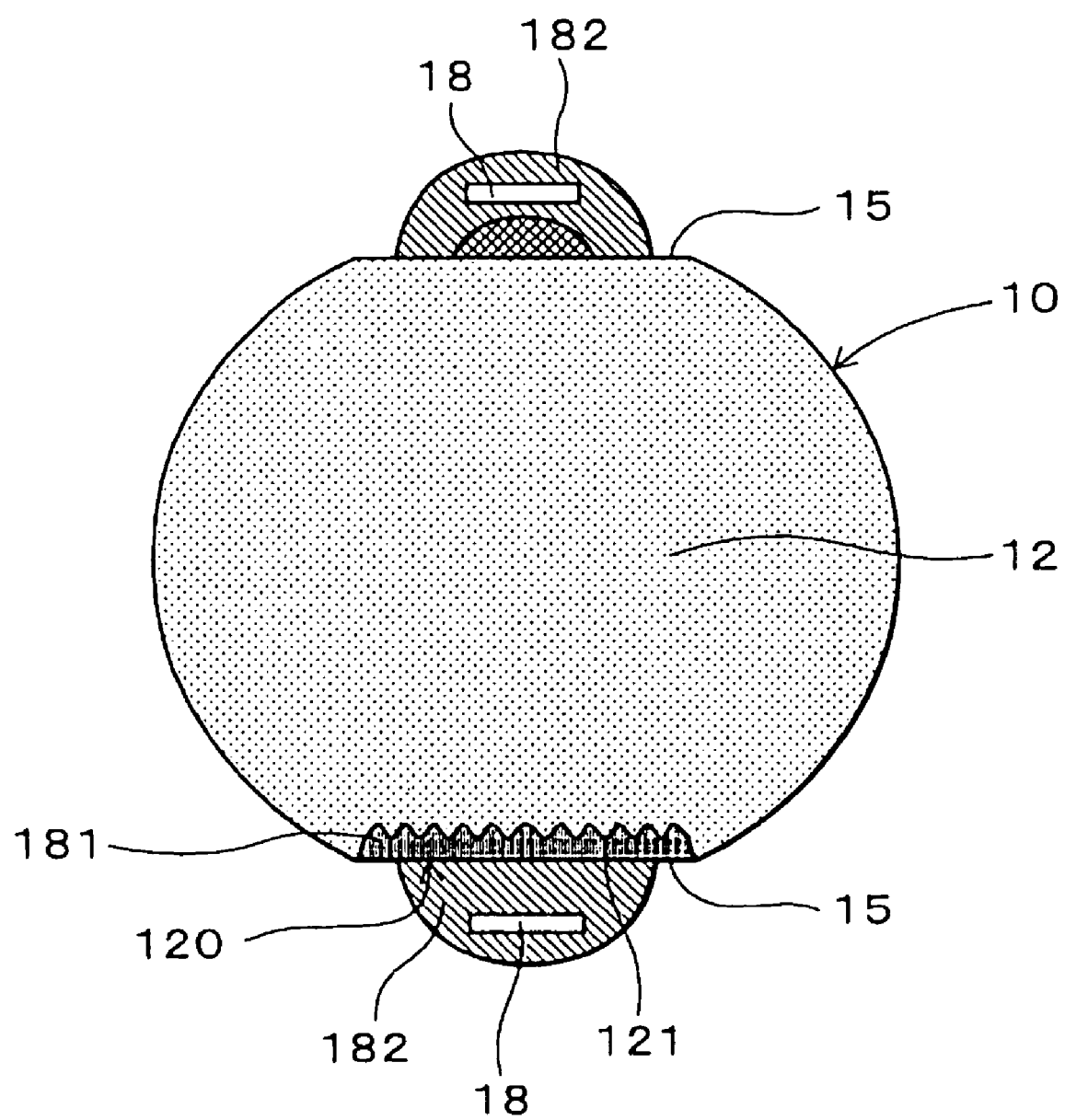
FIG. 17 is a sectional view showing a sectional structure of another lamination-type piezoelectric element along the inner electrode layer in Embodiment 2 of the present invention.

Further, as shown in FIG. 17, the outer circumferential groove portion 120 can be formed only on the joining face 15 of the ceramic laminated body 10.

Embodiment 3

This embodiment is composed in such a manner that the cross-sectional shape of the outer circumferential groove portion, in which the aforementioned insulating portion is formed, is changed in Embodiment 1.

Figure 18:
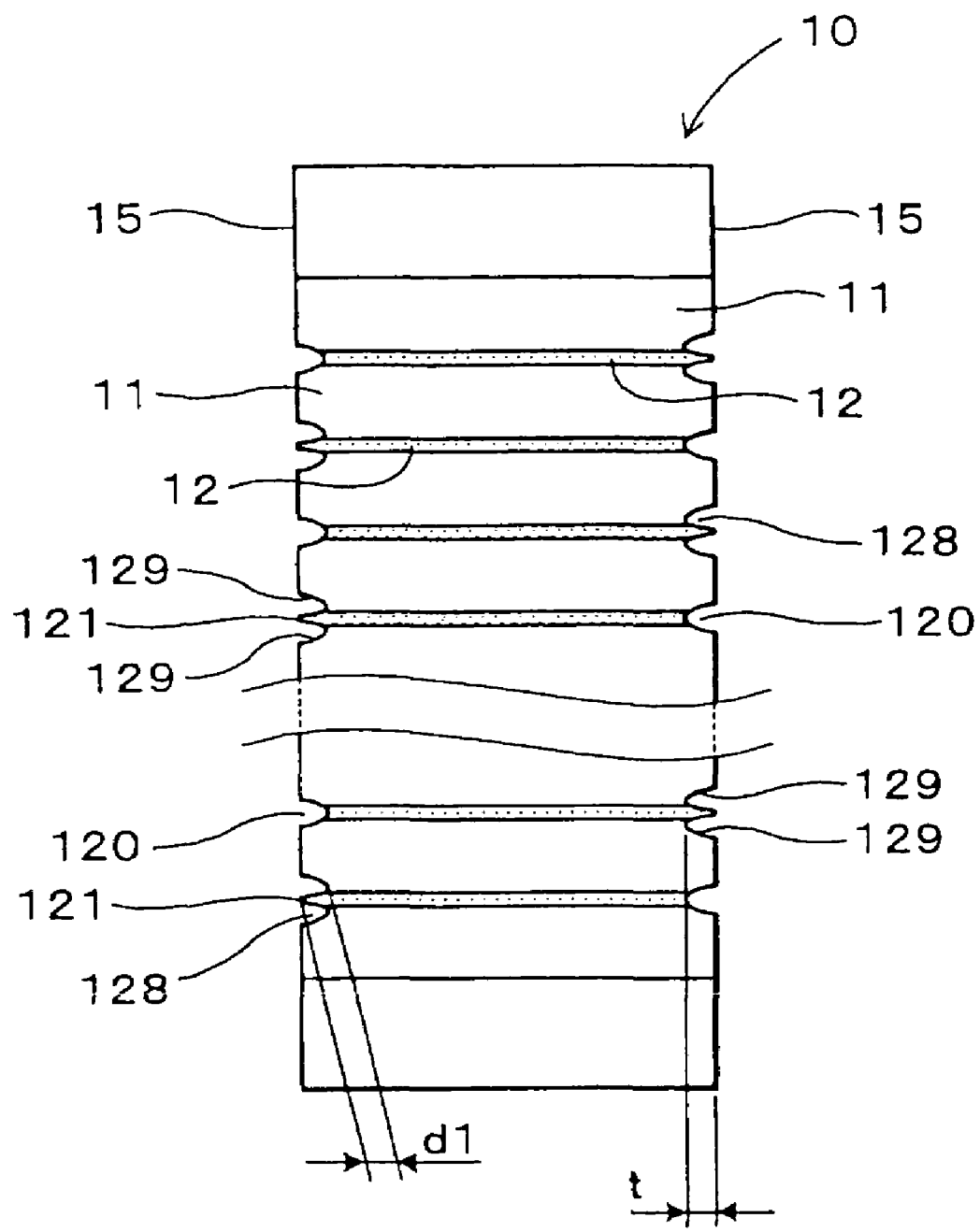
FIG. 18 is a sectional view showing a sectional structure of the ceramic laminated body in Embodiment 3 of the present invention.

As shown in FIG. 18, the cross-sectional shape of the outer circumferential groove portion 128, in which the conductive portion 183 of this embodiment is formed, is formed into a protrusion in which the inner electrode layer 12 is protruded from the bottom portion. This inner electrode layer 12 composes the protruding portion 121.

When this outer circumferential groove portion 128 is formed, two positions located in the axial direction, which are offset with respect to the position in the axial direction of the corresponding inner electrode layer 12, are respectively irradiated with a laser beam so that two groove-shaped dent portions 129, which are substantially parallel with each other, can be formed.

When these dent portions 129 are formed, the irradiating position of a laser beam, the output (W) of which is controlled at a substantially constant value, is moved at a substantially constant speed along the outer circumference of the ceramic laminated body 10.

In this case, as shown in FIG. 18 the offset is set so that the two adjoining groove-shaped dent portions 129 cannot overlap with each other in the axial direction of the ceramic laminated body 10. In this embodiment, two dent portions 129 are formed so that the protruding length d1 of the inner electrode layer protruding from the bottom portion of the outer circumferential groove portion 128 can substantially align with the depth t of the conductive adjoining portion.

Figure 19:
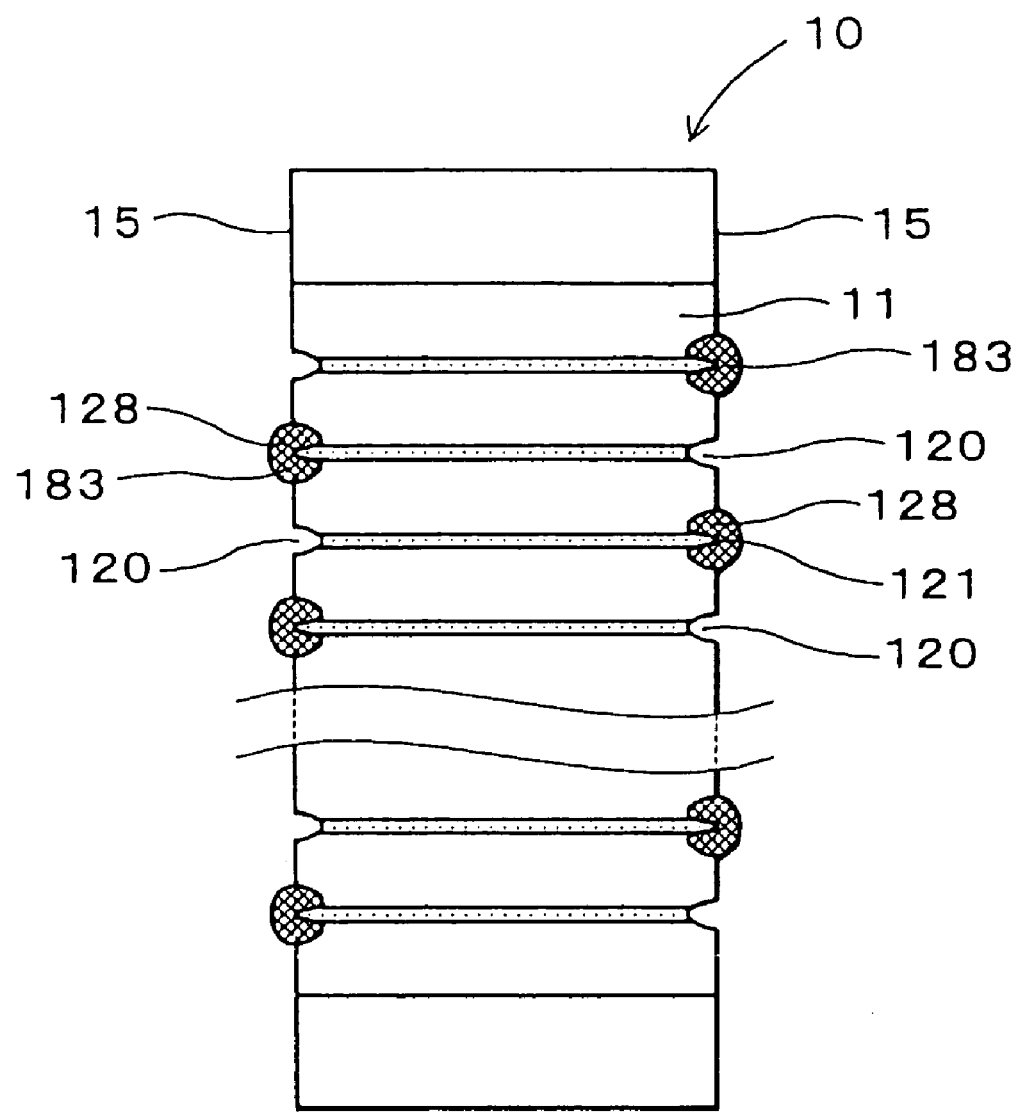
FIG. 19 is a sectional view showing a sectional structure of the ceramic laminated body to which the conductive portion is joined in Embodiment 3 of the present invention.
Figure 20:
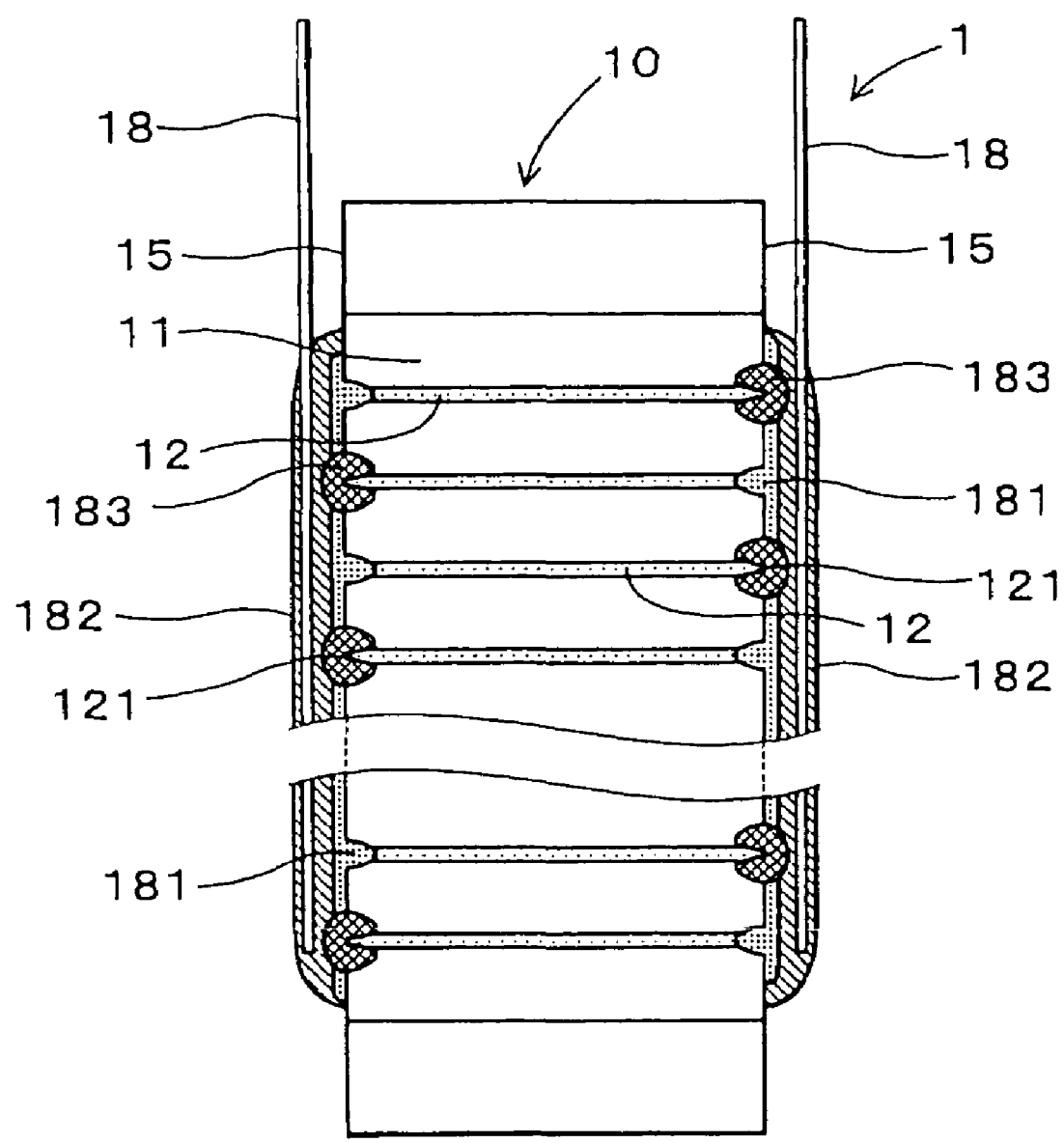
FIG. 20 is a sectional view showing a sectional structure of the lamination-type piezoelectric element in Embodiment 3 of the present invention.

As described above, as shown in FIGS. 19 and 20, the cross-sectional shape of the outer circumferential groove portion 128 of this embodiment is formed into a protruding shape in which the inner electrode layer 12 protrudes from the bottom portion. Therefore, the inner electrode layer 12, which is the protruding portion 121, bites into the conductive portion 183 formed in the outer circumferential groove portion 128. For the above reasons, the joining strength of the conductive portion 183 of this embodiment is enhanced by the wedge effect of the protruding portion 121.

When the inner electrode layer 12 and the conductive portion 183 are contacted with each other on a large contact face, the contact resistance between them can be reduced.

Other point of the structure and operational effect are the same as those of Embodiment 1.

In the case of forming the dent portion 129, in the same manner as that of Embodiment 1, the output (W) of irradiating the laser beam may be made to fluctuate so as to increase and decrease the depth of the dent portion 129.

Figure 21:
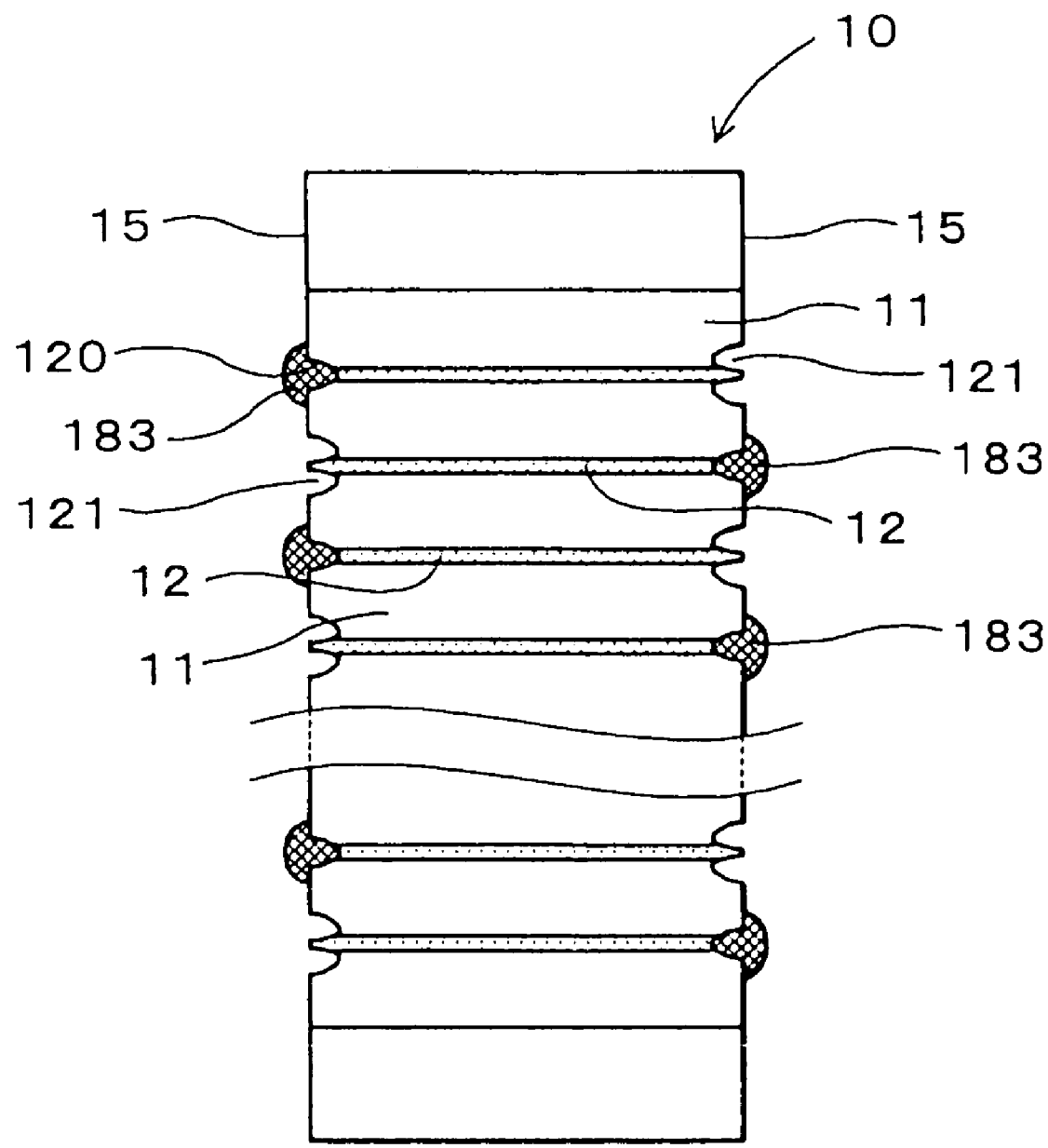
FIG. 21 is a sectional view showing a sectional structure of another ceramic laminated body to which the conductive portion is joined in Embodiment 3 of the present invention.
Figure 22:
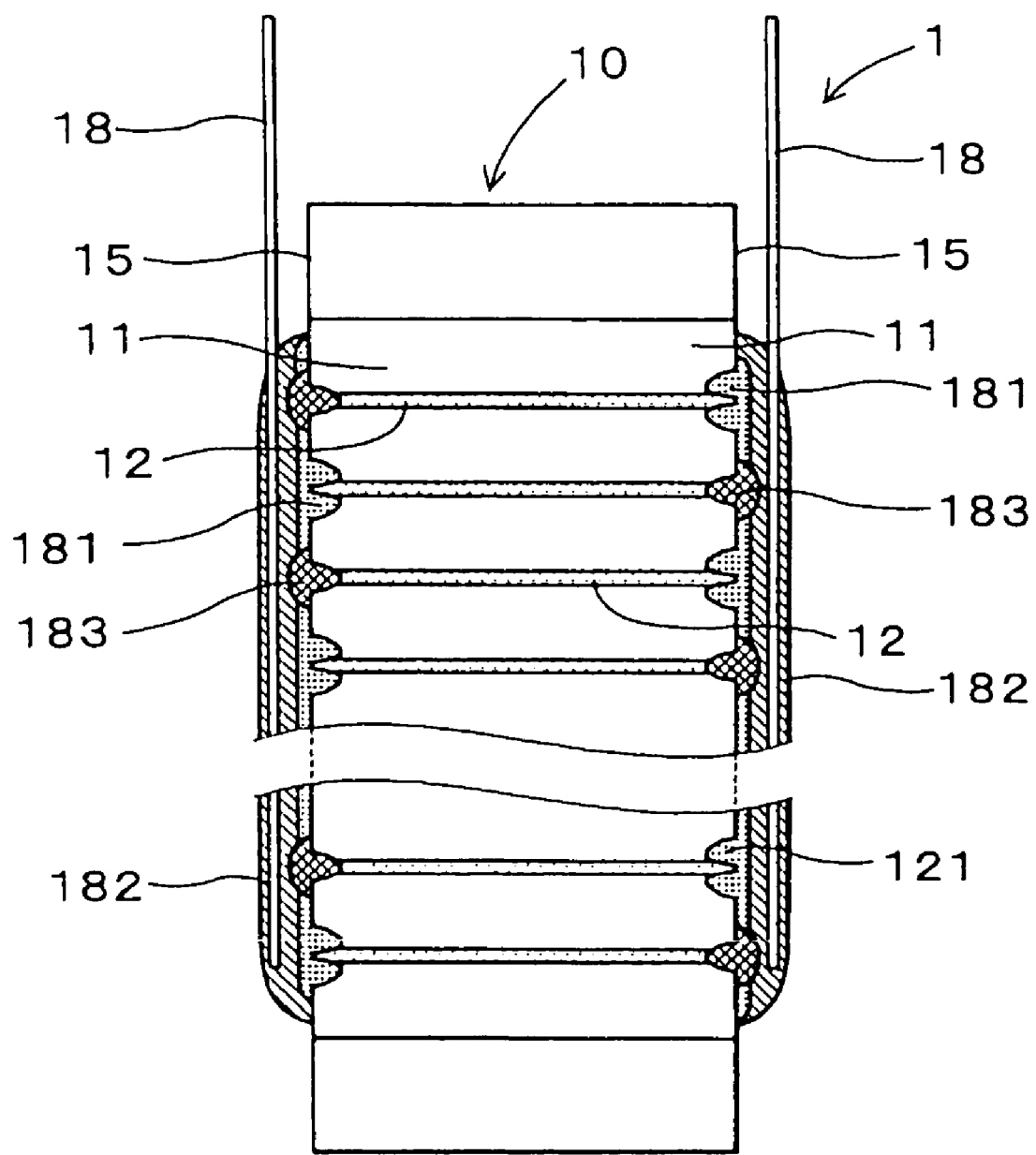
FIG. 22 is a sectional view showing a sectional structure of another laminated type piezoelectric element in Embodiment 3 of the present invention.

As shown in FIGS. 21 and 22, in the ceramic laminated body 10 of this embodiment, the insulating portion 181 and the conductive portion 183 can be replaced with each other. In this case, the joining strength of the insulating portion 181 can be enhanced and the insulating property of the lamination-type piezoelectric element 1 can be further enhanced.

Embodiment 4

In this embodiment, the dent portion in Embodiment 1 is formed by using UV laser beam, the wave-length of which is 355 nm. The contents of this embodiment will be explained referring to FIGS. 23 to 26.

UV laser beam machine (not shown) used in this embodiment is composed in such a manner that the wave-length of the near infrared laser beam, which is emitted from a YAG laser beam generator, is transformed (from 1064 nm to 355 nm in this embodiment) when the laser beam is transmitted through non-linear optical crystals. Excepting the above point, the structure of the laser beam machine of this embodiment is substantially the same as that of the laser beam machine of Embodiment 1.

In this embodiment, the aforementioned dent portion was made by UV laser beam machine in such a manner that a beam spot, in which the laser beam was condensed to the diameter of 20 $\mu$m, was irradiated to the outer surface of the ceramic laminated body described above.

Figure 23:
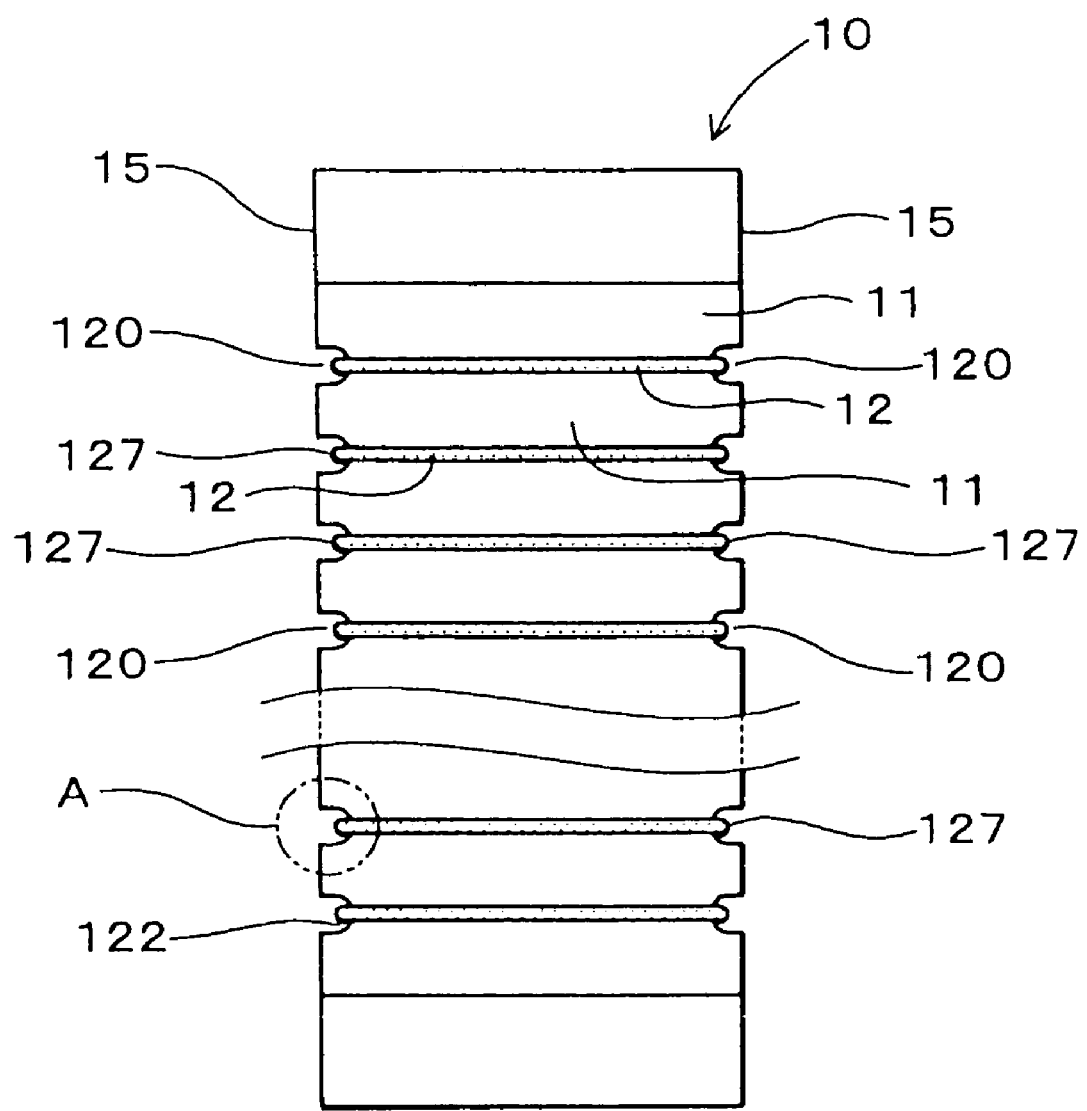
FIG. 23 is a sectional view showing a sectional structure of the ceramic laminated body in Embodiment 4 of the present invention.

In this case, the above laser beam of the short wave-length, the wave-length of which is 355 nm, is characterized in that the reflectance factor with respect to a metal surface including the inner electrode layer 12 is high as shown in FIG. 23.

Accordingly, in the case where the dent portion 122 is machined with the laser beam, the machined depth of the ceramic layer 11 can be made larger than the machined depth of the inner electrode layer 12.

Figure 24:
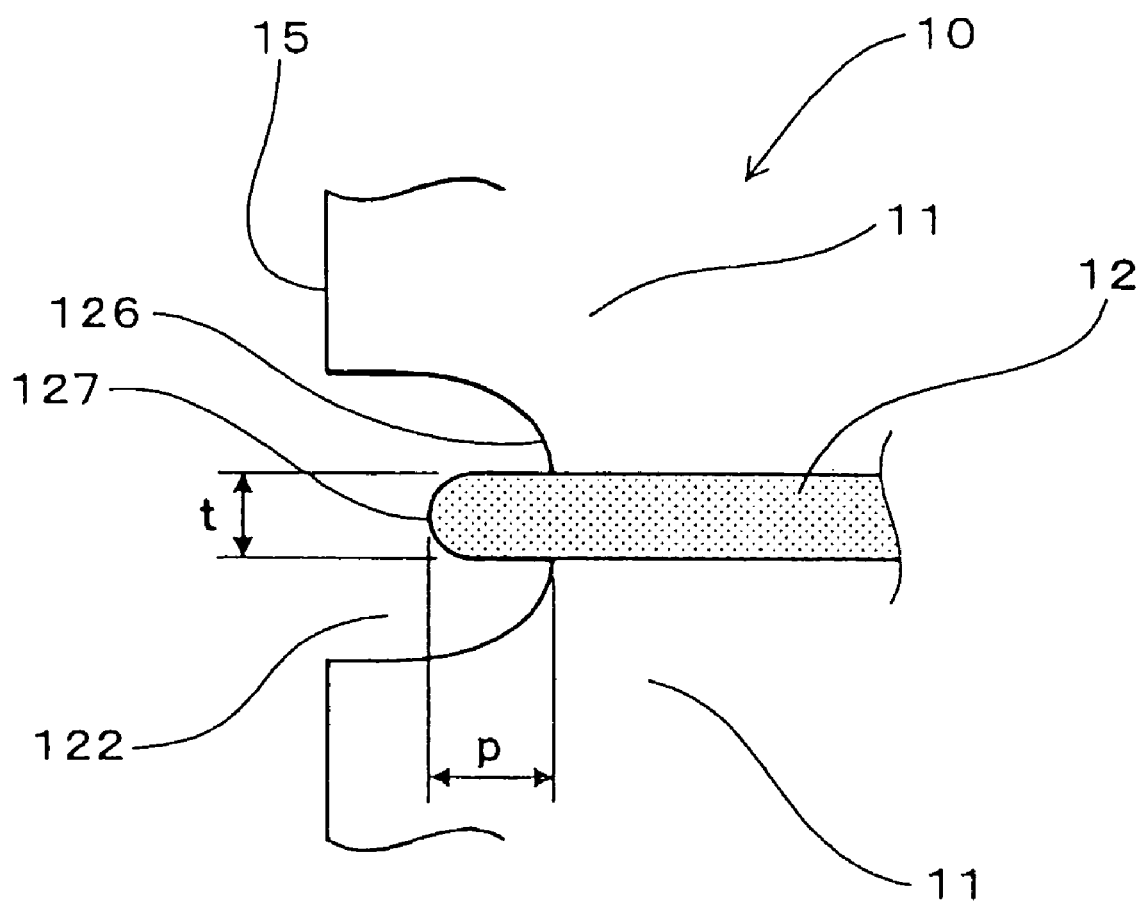
FIG. 24 is an enlarged view of the cross sectional structure of the dent portion of the ceramic laminated body in Embodiment 4 of the present invention, that is.
Figure 25:
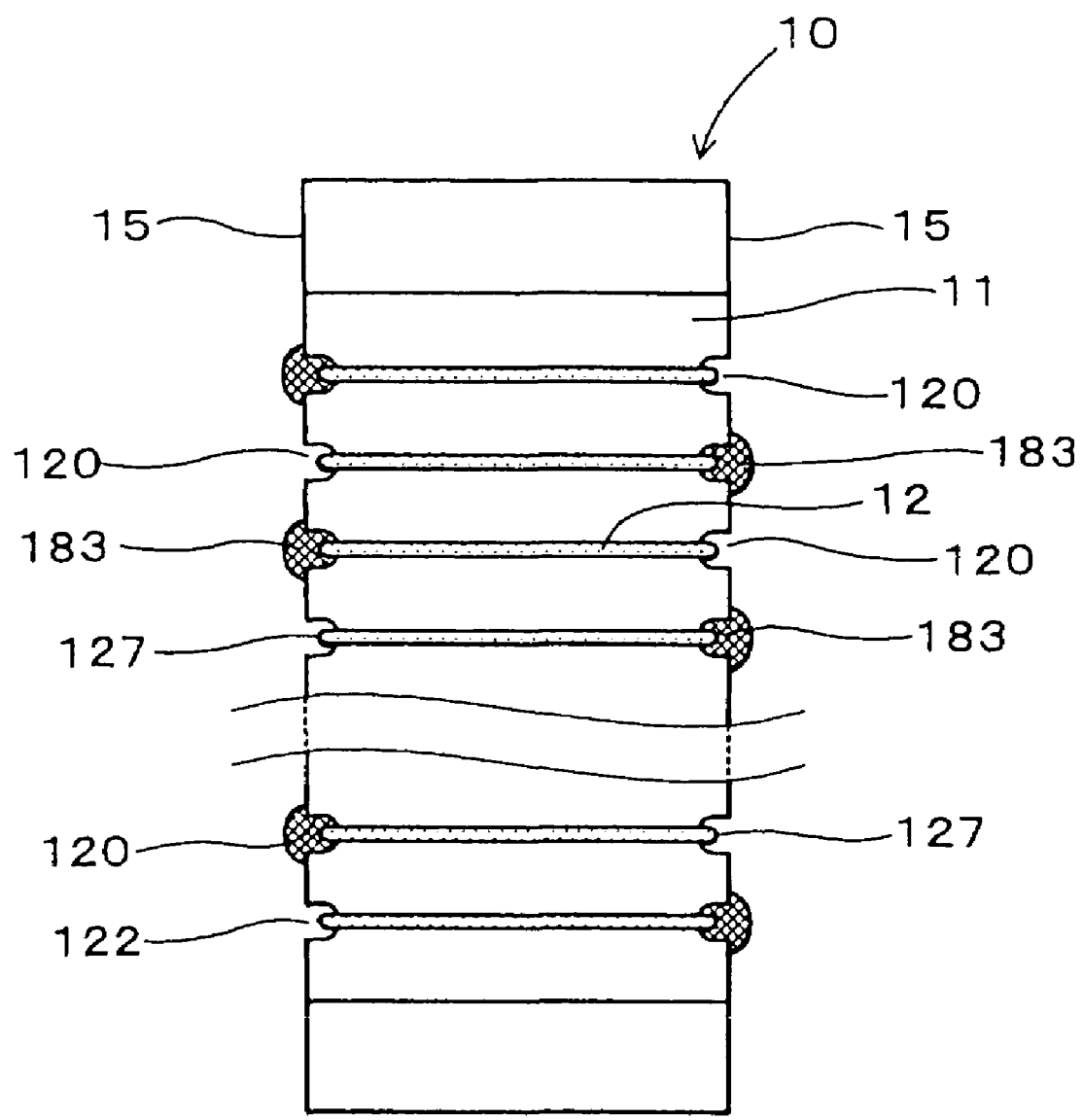
FIG. 25 is a sectional view showing a sectional structure of the ceramic laminated body in which a conductive portion is formed in Embodiment 4 of the present invention.

Therefore, according to the above laser beam, as shown in FIG. 24, the dent portion 122 can be formed so that the outer circumferential end portion 127 of the inner electrode layer 12 can be protruded from the bottom face 126.

Especially, in this embodiment, the laser beam irradiating condition was experimentally adjusted, so that the protruding length p of the outer circumferential end portion 127 could be twice as large as the thickness t of the inner electrode layer 12 as shown in FIG. 24.

According to the dent portion 122 from which the outer circumferential end portion 127 is protruded as described above, as shown in FIG. 25, the conductive portion 183 can be strongly held. The reason is that the outer circumferential end portion 127 protruding from the bottom face 126 (shown in FIG. 24) of the dent portion 122 exhibits the wedge effect (the anchor effect) for the conductive portion 183 filling the dent portion 122.

In the same manner, according to the dent portion 122 of this embodiment, as shown in FIG. 26, the insulating portion 181 can be strongly held. The reason is that the outer circumferential end portion 127 exhibits the anchor effect for the insulating portion 181 filling the dent portion 122.

In this lamination-type piezoelectric element 1, on the outer surface of the ceramic laminated layer 10 of which the insulating portion 181 and the conductive portion 183 are strongly held, an electrical leakage seldom occurs and the electrical reliability is high.

In this connection, the other operational effects are the same as those of Embodiment 1.

In this connection, instead of a UV laser applied to this embodiment, it is possible to apply an excimer laser which is a gas laser for exciting rare gas or mixed gas of rare gas and halogen gas so as to generate a laser beam.

In this connection, the specific embodiment of the present invention is explained in detail in this specification, however, it should be noted that variations can be made by those skilled in that art without departing from the scope and spirit of the present invention.

What is claimed is:

1. A method of manufacturing a lamination-type piezoelectric element which includes a ceramic laminated body, in which ceramic layers and inner electrode layers are alternately laminated on each other, and also includes a pair of outer electrodes respectively joined to a pair of joining faces formed on an outer circumferential face of the ceramic laminated body, the method of manufacturing the lamination-type piezoelectric element comprising:

a laminated body forming step of forming the ceramic laminated body;

a groove forming step of forming a dent portion coming into contact with an outer circumferential end portion of at least some part of the inner electrode layers by irradiating a laser beam onto at least the joining faces on the outer circumferential face of the ceramic laminated body so as to form an outer circumferential groove portion, the shape of a recess portion of which is formed into a belt-shape, or the shapes of a plurality of recess portions connected with each other of which are formed into a belt-shape; and an embedding step of forming at least one of an insulating portion made of insulating material and a conductive portion made of conductive material in the outer circumferential groove portion, wherein the outer circumference groove portion having at least one protruding portion protruding from the periphery inside the dent portion or having at least one protruding portion protruding from the dent portion, arranged between the dent portions adjacent to each other is formed by adjusting an irradiating condition of the laser beam in the groove forming step, and the dent portion is embedded so as to cover the protruding portion by forming at least one of an insulating portion made of insulating material and a conductive portion made of conductive material into the outer circumferential groove portion in the embedding step.

2. A method of manufacturing a lamination-type piezoelectric element according to claim 1, wherein a laser beam is irradiated so that an intensity of irradiating energy, which irradiates at a position where the protruding portion is to be formed, can be lower than an intensity of irradiating energy, which irradiates at a position adjacent to the position where the protruding portion, which protrudes in the direction of the normal line on the outer circumferential face of the ceramic laminated body, is to be formed, in the groove forming step.

3. A method of manufacturing a lamination-type piezoelectric element according to claim 2, wherein the laser beam is a beam generated by a $CO_2$ laser.

4. A method of manufacturing a lamination-type piezoelectric element according to claim 2, wherein the wavelength of the laser beam is not less than 157 nm and not more than 10600 nm.

5. A method of manufacturing a lamination-type piezoelectric element according to claim 2, wherein the diameter of an irradiation spot of the laser beam is not more than 120 μm.

6. A method of manufacturing a lamination-type piezoelectric element according to claim 2, wherein stabilization baking of the ceramic laminated body is executed after the laser beam is irradiated and the dent portion is formed.

7. A method of manufacturing a lamination-type piezoelectric element according to claim 1, wherein the belt-shaped dent portion extending zigzag is formed when the laser beam irradiating position is moved zigzag along the outer circumferential end portion of the inner electrode layer in the groove forming step, and the laser beam is irradiated so that the protruding portion protruding in the laminating direction of the ceramic laminated body can be formed in a bent portion of the dent portion.

8. A method of manufacturing a lamination-type piezoelectric element according to claim 1, wherein a method of manufacturing a lamination-type piezoelectric element, in which a laser beam is irradiated so that an intensity of irradiating energy, which irradiates at a position where the protruding portion is to be formed, can be lower than an intensity of irradiating energy, which irradiates at a position adjacent to the position where the protruding portion, which protrudes in the direction of the normal line on the outer circumferential face of the ceramic laminated body, is to be formed in the groove forming step, and a method of manufacturing a lamination-type piezoelectric element according, in which the belt-shaped dent portion extending zigzag is formed when the laser beam irradiating position is moved zigzag along the outer circumferential end portion of the inner electrode layer in the groove forming step and the laser beam is irradiated so that the protruding portion protruding in the laminating direction of the ceramic laminated body can be formed in a bent portion of the dent portion, are combined with each other and the laser beam is irradiated so as to form the protruding portion.

9. A method of manufacturing a lamination-type piezoelectric element according to claim 1, wherein the laser beam is irradiated at discrete positions distributed along the inner electrode layer by ON-OFF control in which irradiation and non-irradiation of the laser beam are repeated while a position at which the laser beam is to be irradiated is being continuously moved along the inner electrode layer of the ceramic laminated body.

* * * * *